(12) United States Patent
Laville et al.

(10) Patent No.: US 12,402,541 B2
(45) Date of Patent: Aug. 26, 2025

(54) STACKED DIE ASSEMBLY

(71) Applicant: Melexis Technologies SA, Bevaix (CH)

(72) Inventors: Arnaud Laville, Neuchatel (CH); Eric Lahaye, Nandrin (BE); Jian Chen, Heist-op-den-Berg (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 18/194,766

(22) Filed: Apr. 3, 2023

(65) Prior Publication Data

US 2023/0240153 A1 Jul. 27, 2023

Related U.S. Application Data

(63) Continuation of application No. 17/065,004, filed on Oct. 7, 2020.

(30) Foreign Application Priority Data

Oct. 11, 2019 (EP) .................................. 19202699

(51) Int. Cl.
*H10N 52/80* (2023.01)
*G01R 33/07* (2006.01)
(Continued)

(52) U.S. Cl.
CPC ............. *H10N 52/80* (2023.02); *G01R 33/07* (2013.01); *H01L 23/49541* (2013.01);
(Continued)

(58) Field of Classification Search
CPC ...... H10N 52/80; H10N 52/101; G01R 33/07; H01L 23/49541; H01L 23/49575; H01L 25/0657
See application file for complete search history.

(56) References Cited

U.S. PATENT DOCUMENTS

| | | |
|---|---|---|
| 10,049,969 B1 | 8/2018 | Liu |
| 2007/0170533 A1* | 7/2007 | Doogue ................. G01R 33/06 257/422 |

(Continued)

FOREIGN PATENT DOCUMENTS

WO 2014029885 A1 2/2014

OTHER PUBLICATIONS

Extended European Search Report from corresponding EP Application No. 19202699.5, Mar. 24, 2020.
(Continued)

*Primary Examiner* — Latanya N Crawford Eason
(74) *Attorney, Agent, or Firm* — Workman Nydegger

(57) ABSTRACT

A sensor device comprising: a lead frame; a first/second semiconductor die having a first/second sensor structure at a first/second sensor location, and a plurality of first/second bond pads electrically connected to the lead frame; the semiconductor dies having a square or rectangular shape with a geometric center; the sensor locations are offset from the geometrical centers; the second die is stacked on top of the first die, and is rotated by a non-zero angle and optionally also offset or shifted with respect to the first die, such that a perpendicular projection of the first and second sensor location coincide.

16 Claims, 17 Drawing Sheets

(51) Int. Cl.
H01L 23/495 (2006.01)
H01L 25/065 (2023.01)
H10N 52/00 (2023.01)

(52) U.S. Cl.
CPC .... H01L 23/49575 (2013.01); H01L 25/0657 (2013.01); H10N 52/101 (2023.02)

(56) References Cited

U.S. PATENT DOCUMENTS

| | | | | |
|---|---|---|---|---|
| 2009/0315547 | A1* | 12/2009 | Abwa | G01R 33/02 |
| | | | | 324/244 |
| 2012/0081109 | A1 | 4/2012 | Astegher et al. | |
| 2012/0181874 | A1* | 7/2012 | Willkofer | H01L 23/645 |
| | | | | 257/E23.141 |
| 2015/0091560 | A1* | 4/2015 | Deak | G01R 33/093 |
| | | | | 324/252 |
| 2019/0067562 | A1* | 2/2019 | Chetlur | H10N 52/01 |
| 2019/0077256 | A1 | 3/2019 | Onaka et al. | |
| 2019/0120914 | A1 | 4/2019 | Hammerschmidt et al. | |
| 2020/0166326 | A1* | 5/2020 | Ausserlechner | G01B 7/30 |
| 2021/0033646 | A1* | 2/2021 | Bussing | H10N 52/101 |

OTHER PUBLICATIONS

Communication Pursuant to Article 94(3) EPC from Corresponding European Patent Application No. EP20197607.3, Dec. 3, 2024.

* cited by examiner

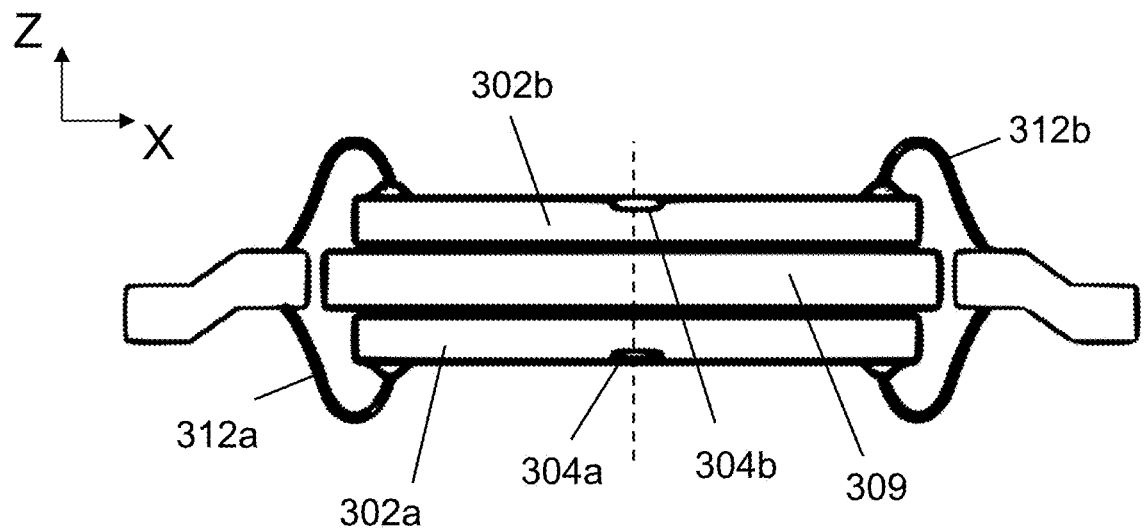
FIG 3
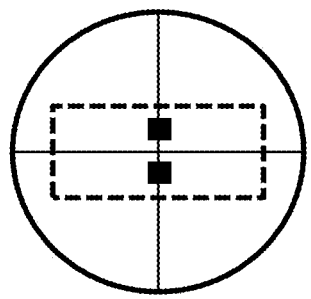
FIG. 4(a)
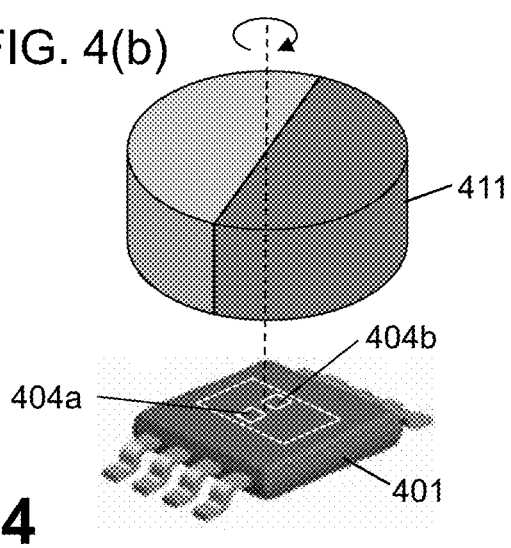
FIG. 4(b)
FIG 4

STACKED DIE ASSEMBLY

FIELD OF THE INVENTION

The present invention relates to the field of sensor devices, and more in particular to a sensor device for use in an automotive environment, the sensor device comprising two semiconductor dies, one for performing an actual measurement and one for performing a redundant measurement.

BACKGROUND OF THE INVENTION

Sensor devices with high reliability are important in a wide variety of applications, such as for example, in automotive applications. Furthermore, it is often preferred to include a plurality of substantially identical sensors, e.g. two sensors, in order to provide redundancy, e.g. in applications that are critical for ensuring safety.

Redundant sensor devices are known in the art, in which a plurality of substrates that each comprise at least one sensor are combined in a single package to provide an actual sensor measurement and a redundant sensor measurement. Devices in which two substrates are placed side by side require a larger footprint, which is undesirable. In order to decrease the footprint, the substrates can be stacked on top of each other, for example as shown in FIG. 1 to FIG. 3, each solution having its advantages and disadvantages, for example in terms of package footprint, package thickness, measurement accuracy, component count, complexity of the production process, etc.

There is always room for improvements or alternatives.

SUMMARY OF THE INVENTION

It is an object of embodiments of the present invention to provide a sensor device comprising two stacked substrates each comprising a sensor structure, in particular a magnetic sensor structure and a magnetic sensor system comprising same.

It is an object of embodiments of the present invention to provide such a sensor device and a sensor system for use in an automotive environment, to perform an actual measurement and a redundant measurement, for example for improving safety.

It is an object of embodiments of the present invention to provide such a sensor device in a compact package, for example having a relatively small or reduced package footprint, and/or a relatively small or reduced package height.

It is an object of embodiments of the present invention to provide such a sensor device where the measurement results (e.g. the measured signals or values derived therefrom) are better matched, and/or which is easy or easier to produce or assemble (e.g. easier to electrically connect to a lead-frame, e.g. easier to wire-bond).

It is an object of particular embodiments of the present invention to provide such a sensor device where the two sensor structures are magnetic sensor structures.

It is an object of particular embodiments of the present invention that the sensor device can have two similar or identical substrates, while at the same time providing measurement results which are better matched, and which is easy or easier to produce or assemble.

It is an object of particular embodiments of the present invention to provide a magnetic sensor device or system, which moreover is highly insensitive to an external disturbance field.

These and other objectives can be achieved by a device and a method according to embodiments of the present invention.

According to a first aspect, the present invention provides a sensor device comprising: a lead frame; a first semiconductor die having a first rectangular shape with a first geometrical center (6a), and being electrically connected to the lead frame, and comprising a first sensor structure situated at a first sensor location; a second semiconductor die having a second rectangular shape equal to the first rectangular shape, and having a second geometrical center (6a), and being electrically connected to the lead frame, and comprising a second sensor structure situated at a second sensor location; wherein the first sensor location is offset from the first geometrical center; the second sensor location is offset from the second geometrical center; the second semiconductor die is stacked on top of the first semiconductor die, and is rotated and optionally also shifted with respect to the first semiconductor die such that an orthogonal projection of the first and the second sensor location onto the lead frame coincide.

The "sensor structure" comprises one or more "sensitive elements".

For example, in case of a "magnetic sensor device", each sensor structure comprises one or more magnetic sensitive elements, and may further comprise for example an integrated magnetic concentrator (IMC). The magnetic sensitive elements may for example be chosen from the group consisting of: horizontal Hall elements, vertical Hall elements, magneto-resistive elements (such as e.g. AMR, GMR, TMR elements).

The "first sensor structure" is located at a "first sensor location", which can be defined as a point located substantially "in the middle" of, or in the middle between the one or more sensitive elements.

Preferably the rotation is a rotation about an axis perpendicular to the lead frame.

Preferably the first and the second semiconductor die are located on the same side of the lead frame and oriented such that their active surfaces are oriented in the same direction (e.g. both away from the lead frame).

Preferably the relative position L1 of the first sensor location with respect to the first rectangular shape is identical to the relative position of the second sensor location with respect to the second rectangular shape.

It is a major advantage of this magnetic sensor device that the electrical connections can be performed on the top side, in a simple manner, using standard equipment, contrary for example to FIG. 1, where the electrical connections 111 (e.g. bond wires) need to be placed before mounting the second semiconductor die, which complicates the processing.

It is an advantage that this sensor device does not require a spacer or interposer to be mounted between the first and second semiconductor die, although in some embodiments it may.

It is a major advantage that the first sensor and the second sensor structure can measure a physical quantity, e.g. magnetic field at substantially the same 3D location. Such a sensor device is ideally suited for automotive applications where redundancy is required.

The first semiconductor die may be mechanically mounted to the lead frame in any suitable way, for example by means of an insulating tape between the lead frame and the first semiconductor die.

The present invention also provides a sensor device comprising: a lead frame; two identical semiconductor dies comprising a first semiconductor die and a second semiconductor die, each die having a rectangular shape with a geometrical center, and each die comprising a sensor structure situated at a sensor location offset from its geometrical center; the second semiconductor die being stacked on top of the first semiconductor die, and being rotated over a non-zero angle, and optionally also shifted with respect to the first semiconductor die such that an orthogonal projection of the first and second sensor location L1, L2 substantially coincide.

It is a major advantage of using two identical semiconductor dies (at least hardware-wise), because this simplifies the design, testing and evaluation of the semiconductor dies.

In an embodiment, the sensor device comprises only two semiconductor dies, namely said first semiconductor die and said second semiconductor die.

In an embodiment, the first semiconductor die comprises a plurality of first bond pads, and the second semiconductor die comprises a plurality of second bond pads, wherein the plurality of first and second bond pads of the stacked dies are exposed for allowing wire-bonding. In an embodiment, the first semiconductor die comprises a plurality of first bond pads wire-bonded to the lead frame; and wherein the second semiconductor die comprises a plurality of second bond pads wire-bonded to the lead frame. In this embodiment, the electrical connection to the lead frame is implemented by means of bond-wires or wire-bonding. It is an advantage that, thanks to the rotation and offset or shift of the two semiconductor dies, the bond pads are exposed at the top side, so that they can easily be wire-bonded.

In an embodiment, the relative position of the first sensor location with respect to the first rectangular shape is identical to the relative position of the second sensor location with respect to the second semiconductor die. In this embodiment, the layout may be identical, but that is not absolutely required. It suffices that the layout is similar.

In an embodiment, the second semiconductor die has a layout identical to that of the first semiconductor die. With having an "identical layout" is meant that a single set a of masks can be used. While not absolutely required for the present invention to work, it is an advantage of embodiments wherein the first and the second semiconductor die are identical, because it largely simplifies the design, characterisation, qualification testing, logistics, assembly, etc.

In certain embodiments, the first semiconductor die is obtained from the same silicon wafer as that of the second semiconductor die.

In other embodiments, the first semiconductor die is obtained from a different silicon wafer as that of the second semiconductor die.

In an embodiment, the stacked dies overlap at least by 60%, or at least by 70%, or at least by 80%, or at least by 90% of the die area.

In an embodiment, the rectangular shape is a square. (having a ratio of Length/Width=1).

In an embodiment, the rectangular shape is not square, having a ratio of Length/Width>1.05).

In an embodiment the first semiconductor die is implemented in a first semiconductor technology (e.g. CMOS at a certain technology node 803*a* in FIG. 8, e.g. 90 nm), and the second semiconductor die is implemented in a second semiconductor technology different from the first semiconductor technology (e.g. CMOS a different technology node 803*b*). For example, the resolution and/or the accuracy of the measurement provided by the first semiconductor die may be better than that of the second semiconductor die, but the second measurement may still be sufficiently accurate to act as a redundant measurement for safety purposes.

In an embodiment, the first rectangular shape has a length defining a length direction (X) and a width defining a width direction (Y) perpendicular to the length direction (X), said length being equal to or larger than said width; and the first sensor location (L1) is offset from a geometrical center of the first semiconductor die by a first predetermined offset (dx) along the length direction, and by a second predetermined offset (dy) in the width direction, wherein at least one of the first and second offset is different from zero.

In an embodiment, one of the first and second predefined offset is equal to zero, and the other of the first and second predefined offset is different from zero.

In an embodiment, each of the first and second predefined distance is different from zero.

In an embodiment, the second semiconductor die is rotated over 180° with respect to the first semiconductor die about an imaginary axis perpendicular to the lead frame; and the second semiconductor die is shifted in the first direction by a first distance equal to twice the first predefined offset, and is shifted in the second direction by a second distance equal to twice the second predefined offset.

In an embodiment, the second semiconductor die is rotated over 90° with respect to the first semiconductor die about an imaginary axis perpendicular to the lead frame.

In an embodiment, the first and second semiconductor die are square and are rotated over 90° relative to each other (e.g. as shown in FIG. 19).

In an embodiment, the first and second semiconductor die are non-square (i.e. are rectangular with a length larger than a width) and are rotated over 90° relative to each other (e.g. as shown in FIG. 20, FIG. 21 or FIG. 22).

In an embodiment, the second semiconductor die is rotated over an angle in the range from 10° to 85° with respect to the first semiconductor die about an imaginary axis perpendicular to the lead frame, for example as shown in FIG. 23 and FIG. 24.

In an embodiment, the first and second semiconductor dies are located on the same side of the lead frame, or stated in other words, the first semiconductor die is located between the lead frame and the second semiconductor die.

In an embodiment, each of said first and second semiconductor die has an active side and a passive side, and wherein the active side of the first semiconductor die is oriented in the same direction as the active side of the second semiconductor die.

In an embodiment the active sides of the first and the second semiconductor dies are both oriented away from, i.e. facing away from the lead frame.

In an embodiment the active sides of the first and the second semiconductor dies are both oriented towards, i.e. facing the lead frame.

In an embodiment, the second semiconductor die is flipped (i.e. turned upside-down) with respect to the first semiconductor die, such that the active side of the first semiconductor die and the active side of the second semiconductor die are facing each other.

In an embodiment, the second semiconductor die is flipped (i.e. turned upside-down) with respect to the first semiconductor die, such that the active side of the first semiconductor die and the active side of the second semiconductor die are facing away from each other.

In an embodiment, each of the first and second semiconductor die has a thickness of at most 300 μm, or at most 250 μm, or at most 200 μm, or at most 175 μm, or at most 150 μm, or at most 125 μm, or at most 100 μm, or at most 75 μm, or at most 50 μm. Such semiconductor dies are known as "thinned semiconductor dies". Processes for producing "thinned wafers" (e.g. using etching techniques) are well known in the art and hence need not be described in more detail here. Using thinned wafers and/or direct stacking on top of each other (see further) offers the advantage that the first and second sensor can be even closer together (as compared to standard wafers having a typical thickness of about 750 micron), hence a difference between the signals measured by the first and second sensor, or values derived therefrom, can be further reduced.

In an embodiment, the second semiconductor die is stacked directly on top of the first semiconductor die, without a spacer or interposer. It is an advantage of direct stacking that no additional component (e.g. a spacer or interposer) is required, thus saving material. It is a further advantage that the sensors are located closer together.

In an embodiment, the second semiconductor die is stacked on top of the first semiconductor die with a layer of glue in between.

In an embodiment, the second semiconductor die is stacked on top of the first semiconductor die using an intermediate isolation layer. It is an advantage of such intermediate isolation layer that the galvanic separation between the two semiconductor dies can be further improved (as compared to a passivation layer at the bottom of the second semiconductor die).

In an embodiment, the first semiconductor die is galvanically separated from the second semiconductor die.

In preferred embodiments, the two semiconductor dies are galvanically isolated from each other (at package level, maybe not at printed-circuit-board (PCB) level.

Preferably the two semiconductor dies use different pins for grounding and for power supply.

In an embodiment, the first sensor structure on the first semiconductor die is identical to the second sensor structure on the second semiconductor die, for example as shown in FIG. 15 and FIG. 16.

In an embodiment, the first sensor structure on the first semiconductor die is different from the second sensor structure on the second semiconductor die, for example as shown in FIG. 18.

In both cases, the first and second silicon die are configured to perform the same overall function, for example to determine an angular position based on magnetic measurements, but the actual implementation, for example the type of sensitive elements and/or the physical arrangement of the sensitive elements may be different. As an example, the first sensor structure may contain horizontal Hall elements, while the second sensor structure contains vertical Hall elements. As another example, both sensor structures contain a plurality of vertical Hall elements arranged on a circle with the same diameter, but the vertical Hall elements of the first silicon die are arranged to measure a circumferential magnetic field component (tangential to the imaginary circle), whereas the vertical Hall elements of the second silicon die are configured to measure at a radial magnetic field component. Such a sensor device is very useful for functional safety, for example to avoid "common cause" failure modes.

In an embodiment, only one of the first and second predefined distance is zero, (thus the other predefined distance is different from zero).

In an embodiment, the first and second semiconductor die are square, and the first predetermined offset is non-zero, and the second predetermined offset is zero; and the second semiconductor die is shifted with respect to each of the edges of the first semiconductor die by said predetermined offset (DX=dx and DY=dx), as illustrated for example in FIG. 19.

In an embodiment, each of the first and second predefined distance is different from zero.

In an embodiment, the first and second semiconductor dies have bond pads located adjacent only one edge of the rectangle or square shape (see e.g. FIG. 15, FIG. 16, FIG. 18 to FIG. 20, FIG. 22 to FIG. 24).

In an embodiment, the first and second semiconductor dies have bond pads located adjacent two edges of the rectangle or square shape (see e.g. FIG. 21).

In an embodiment, the first sensor structure and the second sensor structure are magnetic sensor structures.

In an embodiment, the sensor device is a redundant linear position sensor device for use in automotive applications.

In an embodiment, the sensor device is a redundant angular position sensor device for use in automotive applications.

In an embodiment, the first and second sensor structure comprises one or more magnetic sensitive elements and optionally one or more integrated magnetic concentrators (IMC). The magnetic sensitive elements can for example be selected from the group consisting of a horizontal Hall element, a vertical Hall element, a circular Hall element, a magneto-resistive element, e.g. an XMR element, GMR element, TMR element, or combinations hereof. The magnetic sensor structures may be configured for measuring at least one magnetic quantity, for example one magnetic field component (e.g. Bx, By, Bz), or two magnetic field components (e.g. Bx and Bz) at substantially the same location, or a magnetic field gradient (e.g. $dBx/dx$, $dBx/dy$, $dBy/dx$, $dBy/dx$, $dBz/dx$, $dBz/dy$).

In an embodiment, the first sensor structure and the second sensor structure each contain a single magnetic sensitive element (for example selected from the group consisting of: a horizontal Hall element, a vertical Hall element, a circular Hall element, a magneto-resistive element, a GMR element, an XMR element, a TMR element).

In an embodiment, the first sensor structure and the second sensor structure each contain a plurality of magnetic sensitive elements.

The "sensor structure" may comprise two sensors spaced apart over a predefined distance, each sensor comprising for example two horizontal Hall elements and an IMC. Such "sensor structure" is capable of measuring an in-plane field gradient (e.g. $dBx/dx$ or $dBz/dx$).

In an embodiment, the first sensor structure and the second sensor structure each contain one or more integrated magnetic concentrators, and the semiconductor dies have a thickness of at least 100 micron, or at least 125 micron, or at least 150 micron, or at least 175 micron, or at least 200 micron, but preferably less than 500 micron, or less than 350 micron.

In an embodiment, the first sensor or the first sensor group on the first semiconductor die, and the second sensor or the second sensor group on the second semiconductor die comprises one or more horizontal Hall elements with one or more integrated magnetic concentrators.

In an embodiment, the first sensor or the first sensor group on the first semiconductor die, and the second sensor or the second sensor group on the second semiconductor die comprises one or more horizontal Hall elements without integrated magnetic concentrators.

In an embodiment, the first sensor or the first sensor group on the first semiconductor die, and the second sensor or the second sensor group on the second semiconductor die comprises one or more vertical Hall elements; and/or TMR, GMR, AMR.

In an embodiment, the first sensor or the first sensor group on the first semiconductor die, and the second sensor or the second sensor group on the second semiconductor die comprises one or more magneto-resistive elements.

In an embodiment, the first and second sensor structure are MEMs sensor devices, for example an accelerometer, a gyroscope, etc.

In an embodiment, each of the semiconductor dies comprises a programmable processor and a non-volatile memory, and these processors are configured for running identical software instructions stored in the non-volatile memory. In this case, external compensation (e.g. by an external ECU) may be needed to compensate for the 90° or 180° (or other angle) rotation of the two semiconductor dies.

In an embodiment, each of the semiconductor dies comprises a programmable processor and a non-volatile memory, and both processors are configured for determining an angular position, but one of the processors is configured for additionally compensating the rotation of the two semiconductor dies, such that both semiconductor dies provide substantially the same value. In this case, external compensation (e.g. by an external ECU) is not required. This is a major advantage, because it provides "true redundancy".

In an embodiment, each of the first and second semiconductor die is configured for providing a linear or an angular position based on magnetic field gradients. Using gradient signals offers the advantage that the measurement is substantially independent of an external disturbance field.

According to a second aspect, the present invention also provides a sensor system comprising: a magnetic sensor device according to certain embodiments of the first aspect; and a magnetic source arranged in the vicinity of the magnetic sensor device.

In an embodiment, said magnetic source comprises at least one permanent magnet.

The permanent magnet may be an axially or diametrically magnetized cylindrical or ring-shaped or disk-shaped magnet, forming a dipole, quadrupole or higher-order magnetic field.

In an embodiment the sensor system may be connected to, or further comprise an external processor, for example an ECU (Engine Control Unit) in an automotive environment.

Use of sensor device or a sensor system as described above, for performing a measurement and the redundant measurement in an automotive environment, for improved reliability.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1 to FIG. 3 show three prior-art approaches for integrating two sensors on two dies to form a redundant sensor package.

FIG. 1 shows an assembly with two identical dies separated by a spacer or interposer.

FIG. 2 shows an assembly with two identical dies without a spacer or interposer.

FIG. 3 shows an assembly with two identical dies located on opposite sides of a lead frame.

FIG. 4, with FIGS. 4(a) and 4(b), FIG. 5 with FIGS. 5(a) and 5(b), and FIG. 6 with FIGS. 6(a) and 6(b), illustrate a disadvantageous effect of non-alignment of magnetic sensors as would be obtained by some prior art systems comprising a magnet and a sensor device, in a so called "on-axis" assembly, an "off-axis" assembly, and a "through shaft" assembly, respectively.

FIG. 7 shows a first exemplary rectangular semiconductor die having a sensor (or sensor structure) which is offset from the geometric center of the die in the width direction (Y), in top view.

FIG. 8 shows a stack of two semiconductor dies shown in FIG. 7 in top view, after shifting and rotating the upper die by 180°, as can be used in embodiments of the present invention.

FIG. 9 shows the stack of FIG. 8 in side view, wire-bonded to a lead frame, as can be used in sensor devices according to embodiments of the present invention.

FIG. 10 shows a second exemplary rectangular semiconductor die having a sensor (or sensor structure) which is offset from the geometric center of the die in both the length (X) and the width (Y) direction.

FIG. 11 shows a stack of two semiconductor dies shown in FIG. 10, after shifting and rotating the upper die by 180° such that the sensor elements are vertically aligned, as can be used in embodiments of the present invention.

FIG. 19(*b*) shows a stack of two semiconductor dies as shown in FIG. 19(*a*) in top view, after rotating the upper die by 90° and after shifting the upper die so as to align the magnetic centers of the sensor structures, according to an embodiment of the present invention.

FIG. 20(*b*) shows a stack of two semiconductor dies shown in FIG. 20(*a*) in top view, after rotating the upper die by 90° and after shifting the upper die so as to vertically align the sensors, according to an embodiment of the present invention.

FIG. 21(*b*) shows a stack of two semiconductor dies shown in FIG. 21(*a*) in top view, after rotating the upper die by 90° and after shifting the upper die so as to vertically align the sensors, according to an embodiment of the present invention.

FIG. 22(*b*) shows a stack of two semiconductor dies shown in FIG. 22(*a*) in top view, after rotating the upper die by 90° and after shifting the upper die so as to vertically align the sensors, according to an embodiment of the present invention.

Figure 1:
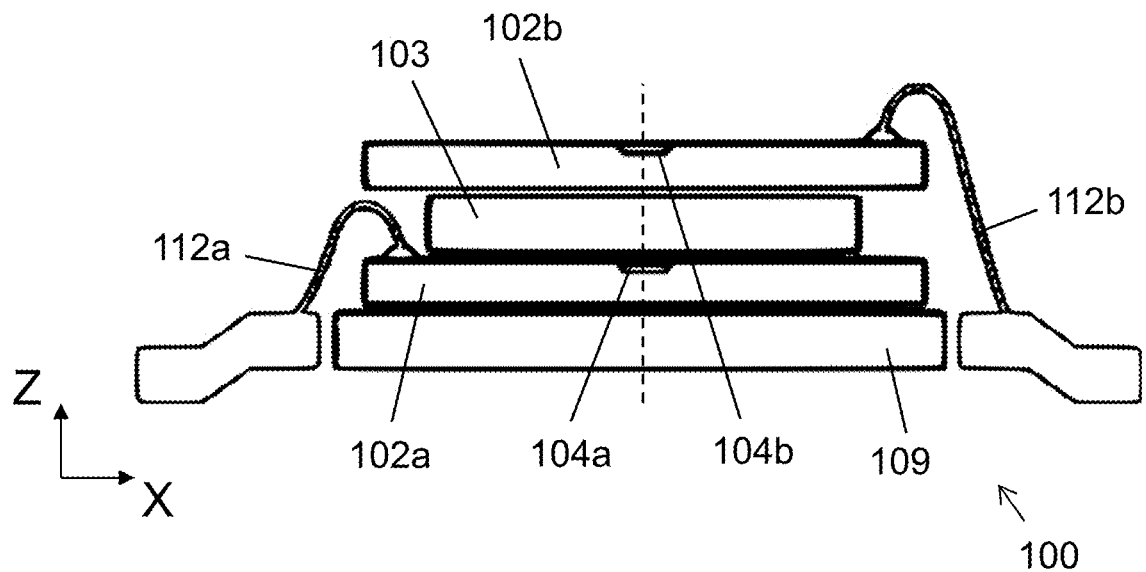

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the term "sensor" or "sensor structure" is to be interpreted broadly, as referring to a single sensor component or sensor element or a plurality of components or a structure for measuring a physical quantity, for example a MEMs structure, an accelerometer, a gyroscope, a "magnetic sensor structure" comprising a single or a plurality of magnetic sensitive elements with or without integrated magnetic concentrators.

In this document, the term "magnetic sensor element" or "magnetic sensor" can refer to a component or a group of components or a sub-circuit or a structure capable of measuring a magnetic quantity, such as for example a magneto-resistive element, a GMR element, an XMR element, a TMR element, a horizontal Hall plate, a vertical Hall plate, a circular Hall element, a Wheatstone-bridge containing at least one (but preferably four) magneto-resistive elements, etc. or combinations hereof.

Figure 17A:
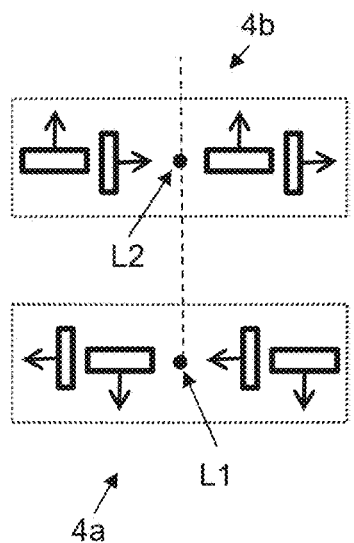
FIG. 17(a) to FIG. 17(f) show several other exemplary magnetic sensor structures which can also be used in the first and second semiconductor die of exemplary sensor devices according to embodiments of the present invention, shown in top view rather than perspective view, for illustrative purposes. But the present invention is not limited thereto, and other sensor structures can also be used.
Figures 17B, 17C:
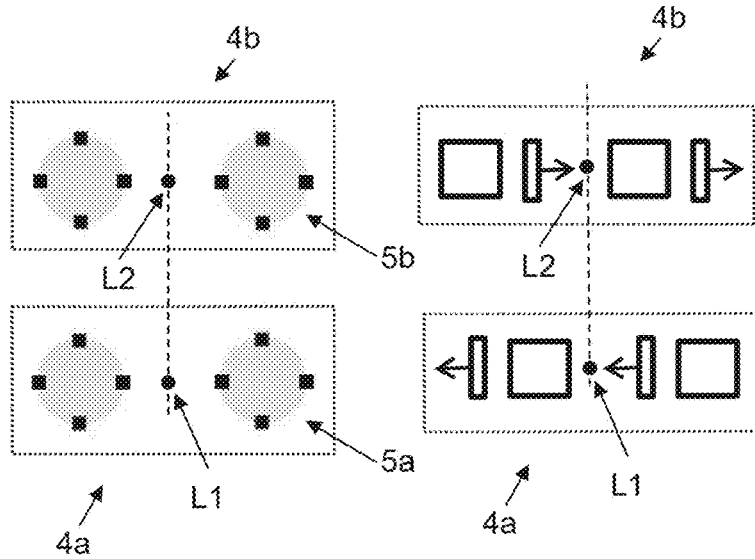
Figure 17D:
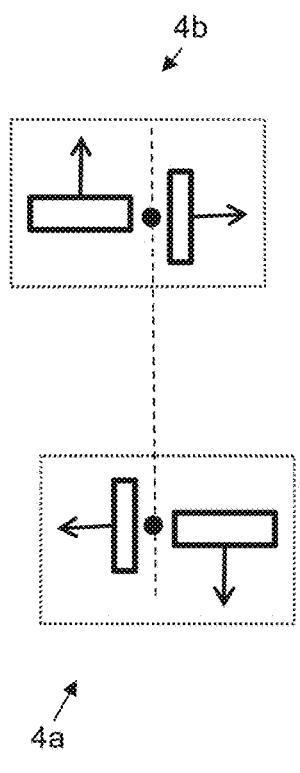
Figures 17E, 17F:
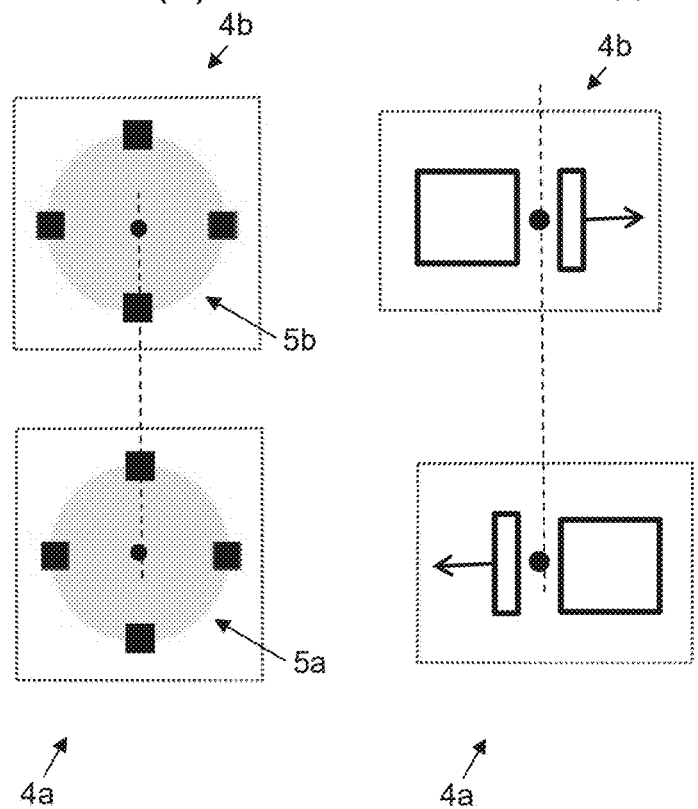

In certain embodiments of the present invention, the "magnetic sensor structure" may comprise one or more integrated magnetic concentrators (IMC) and one or more horizontal Hall elements, for example a disk shaped IMC 5a, 5b and two or four horizontal Hall elements arranged near the periphery of the IMC, for example as illustrated in FIG. 17(b) or as illustrated in FIG. 17(e).

The phrase "the geometrical center is offset from the sensor location" means the same as "the sensor location is offset from the geometrical center", meaning that they do not coincide.

The present invention relates to the field of sensor devices, and more in particular to a sensor device for use in an automotive environment. The device comprising two semiconductor dies for performing a dual measurement, e.g. one for performing an actual measurement and one for performing a redundant measurement, as can be used for safety purposes.

While the invention works for several kinds of sensors, e.g. micro-electro-mechanical systems (MEMs) such as accelerometers or gyroscopes, magnetic sensors, and other sensors, the present invention will be described primarily for magnetic sensors, to simplify the description, but the present invention is not limited thereto.

As stated in the background section, dual or redundant sensor devices are known in the art. Such devices typically comprise two substrates in a single package, one for providing a first sensor measurement (e.g. an actual sensor measurement), the other for providing a second measurement (e.g. a redundant sensor measurement). Devices in which two substrates are placed side by side require a relatively large footprint, thus require more board space, which is undesirable. In order to decrease the footprint, the substrates can be stacked on top of each other, for example as shown in FIG. 1 to FIG. 3, showing three existing solutions for integrating two sensors, one on each die, to form a redundant sensor package.

FIG. 1 shows an assembly 100 with two identical substrates 102a, 102b, stacked on top of each other with an intermediate spacer or interposer 103. The first substrate 102a has a first sensor 104a. The second substrate 102b has a second sensor 104b. The two substrates are aligned, and also the two sensors are aligned (in the Z-direction). The first substrate 102a is connected to the lead frame 109 via first bonding wires 112a. The second substrate 102b is connected to the lead frame 109 via second bonding wires 112b. A disadvantage of this assembly 100 is that it requires a spacer 103 (also referred to as interposer) to allow the first substrate 102a to be wire bonded to the lead frame 109. The spacer 103 increases the bill of material, increases the height of the package, increases the distance between the two sensors 104a, 104b (in the height direction), and complicates the assembly process.

Figure 2:
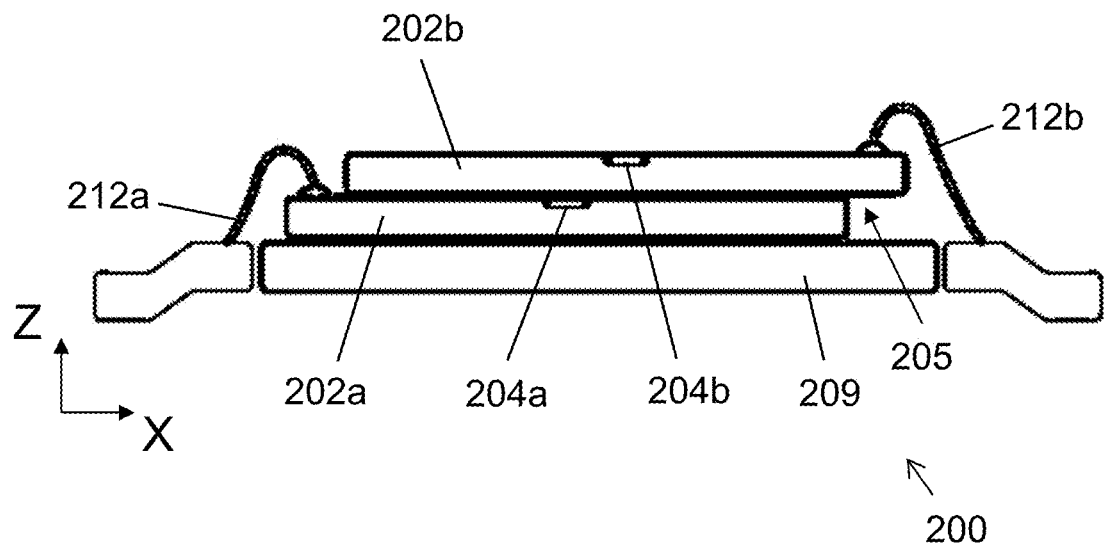

FIG. 2 shows an assembly with two identical substrates 202a, 202b without a spacer or interposer. The first substrate 202a has a first sensor 204a. The second substrate 202b has a second sensor 204b. The second substrate 202b is shifted with respect to the first substrate 202a (in the X-direction) for exposing bond pads of the first substrate 202a, so that these can be wire bonded to the lead frame 209. The two sensors 204a, 204b are misaligned.

FIG. 3 shows an assembly with two identical substrates 302a, 302b mounted to opposite sides of a lead frame 309. The first substrate 302a has a first sensor 304a. The second substrate 302b has a second sensor 304b. As can be seen, the first substrate 302a is aligned to the second substrate 302b, and the first sensor 304a is aligned to the second sensor 304b. The two sensors are separated by the thickness of the lead frame 309. However, bonding on both the upper side and the lower side of the lead frame 309 is not a standard process, and considerably complicates the assembly process.

While sensor misalignment may not be a problem in certain applications, for example sensors to measure the earth's gravitational field, sensor misalignment is of concern in certain applications such as for example magnetic sensor systems, e.g. linear or angular position sensor systems.

Figure 5A:
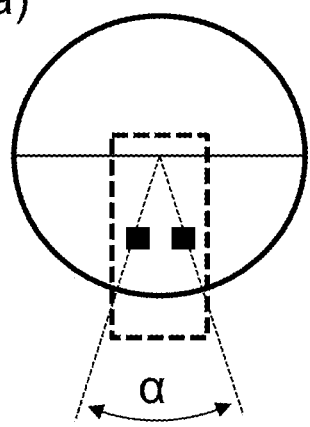
Figure 5B:
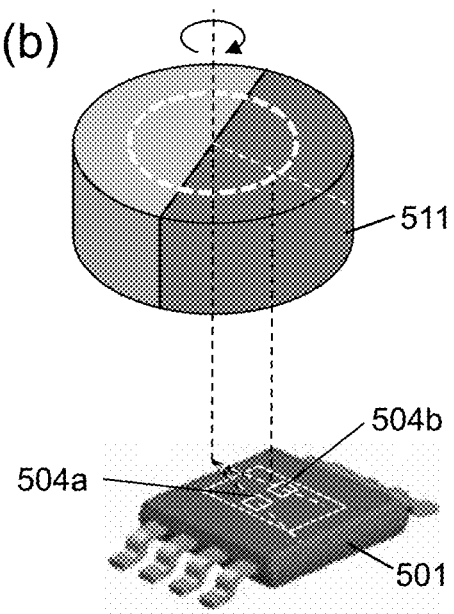
Figure 6A:
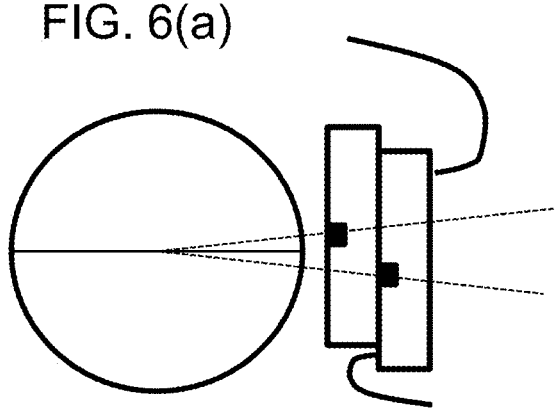
Figure 6B:
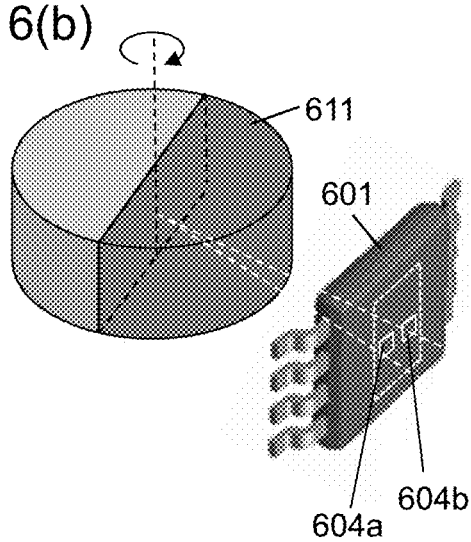

FIG. 4 to FIG. 6 illustrate a problem when using a sensor device 401, 501, 601 with a sensor configuration as shown in FIG. 2, in an angular position sensor system comprising a permanent magnet 411, 511, 611 respectively. FIG. 4 shows a so called "on-axis" arrangement. FIG. 5 shows a so called "off-axis" arrangement. FIG. 6 shows a so called "through shaft" arrangement respectively.

It is noted that the sensors are schematically represented by a black square in order not to complicate the drawings, but of course in practice the sensors may have a (much) more complicated structure (see for example FIG. 15 to FIG. 18).

It can be easily understood that the first sensor 404a, 504a, 604a will provide another value than the second sensor 404b, 504b, 604b, because it is located at a different location (typically at least 1 mm apart, or at least 750 micron apart, or at least 500 micron apart). The larger the distance between the sensor locations, the larger the deviation between the sensor signals, which is undesirable. In an ideal dual sensor device, the first substrate would provide exactly the same signal as the second substrate. This offers the advantage that the threshold for detecting an error or a fault condition can be decreased.

The inventors of the present invention were asked to provide a sensor device with a better match between the measurement results (e.g. angular position) provided by the two semiconductor dies, but preferably without the disadvantages of the prior art, in particular without significantly increasing the package thickness, and/or without significantly increasing material cost, and/or without significantly complicating the assembly process, and preferably all of these.

Facing this challenge, and after many considerations, the inventors surprisingly came to the idea of providing a sensor device comprising a lead frame, a first semiconductor die electrically connected to the lead frame, and a second semiconductor die electrically connected to the lead frame. The first semiconductor die comprising a first sensor or sensor structure situated at a first sensor location, the second semiconductor die comprising a second sensor or sensor structure situated at a second sensor location. The first semiconductor die has a first rectangular shape with a first geometrical center offset from the first sensor location. The second semiconductor die has a second rectangular shape equal to the first rectangular shape and has a second geometric center offset from the second sensor location. The second semiconductor die is stacked on top of the first semiconductor die, and rotated over a non-zero angle, and optionally also shifted over a non-zero distance with respect to the first semiconductor die such that an orthogonal projection of the first and second sensor locations onto the lead frame coincide.

Stated in simple terms, such a sensor device can be referred to as a "stacked die assembly" comprising two semiconductor dies, wherein the two sensor structures are "aligned" and can easily be bonded in the standard manner (from the top). In case the electrical connection is done using wire-bonding, such an assembly is also referred to as a "wire-bonded stacked die assembly". Preferably, the stacked die assembly is over moulded with a plastic compound, to form a "(wire bonded) stacked chip package" (not shown).

The first sensor or sensor structure comprises one or more sensor elements, e.g. magnetic sensitive elements, and optionally further elements (e.g. integrated magnetic concentrator). Likewise, the second sensor or sensor structure comprises one or more sensor elements, e.g. magnetic sensitive elements, and optionally further elements (e.g. integrated magnetic concentrator).

With "sensor location" (for example L1 in FIG. 15) is meant a (real or imaginary) central location defined by the one or more sensitive elements, for example substantially in the middle between the sensitive elements. For example, in case of a single sensitive element, the "sensor location" is defined as the location of the single sensitive element. In case of a sensor structure having a plurality of sensitive elements arranged on a virtual circle, the "sensor location" is defined as the centre of the virtual circle. In case of a sensor structure having two spaced apart sensing elements, the "sensor location" is defined as the location in the middle between the two sensing elements, etc.

The inventors surprisingly found a unique and very advantageous combination of technical features, namely: (1) two semiconductor dies, (2) stacked on top of each other, (3) both dies having a sensor location which is offset from a geometrical center of the die (not located in the middle), (4+5) the upper die is rotated (4) and shifted (5) with respect to the lower die such that a perpendicular projection of the sensor coincide.

This unique combination offers the advantage that the two sensor locations are "vertically aligned", so that the first and second sensor can measure substantially the same physical (e.g. magnetic) quantity or quantities, contrary to the stack shown in FIG. 2, where the first and second sensor locations are offset in at least one direction parallel to the lead frame.

Preferably each of the dies further comprises bond pads located on their active surface, which bond pads are preferably exposed at their top-side when the dies are stacked. This facilitates easy wire-bonding from the top.

It is a major advantage of this magnetic sensor device that the electrical connections, e.g. wire-bonding can be performed on the top side, in a simple manner, using standard equipment, contrary to FIG. 1, where the bond wires 111 need to be placed before mounting the second semiconductor die, which complicates the processing.

It is an advantage that the stacked arrangement proposed by the present invention does not require a spacer or interposer to be mounted between the first and second semiconductor die, although in some embodiments it may.

It is a major advantage that the first sensor and the second sensor can measure the physical quantity, e.g. magnetic field at substantially the same 2D or even 3D location. Such a sensor device is ideally suited for automotive applications where redundancy is required for safety reasons.

It is noted in this respect that "redundancy" does not require that exactly the same circuitry is used on the first and second semiconductor die, and/or that exactly the same physical quantity/quantities is/are to be measured at exactly the same physical location(s) (see e.g. FIG. 16 where individual sensor elements are not aligned, but the sensors as a whole are aligned), and/or that the measurement results or values derived therefrom need to be exactly the same (e.g. an angle measured by the first semiconductor die of FIG. 9 may be 180° phase shifted with respect to an angle measured by the second semiconductor die), but the measurement results or values derived therefrom obtained from the first semiconductor die are consistent with those obtained from the second semiconductor die.

While not absolutely necessary (see e.g. FIG. 18), in preferred embodiments, the first semiconductor die is exactly the same as the second semiconductor die (meaning: is made using all of the same masks). If both obtained from the same wafer, this may further improve the match of the results provided by the first and second semiconductor die. If taken from different wafers, this may reduce the risk of a common cause failure mode related to wafer processing.

In preferred embodiments the semiconductor dies are stacked directly on top of each other (without an intermediate component or layer), and are preferably thinned to a thickness less than 350 µm, e.g. less than 300 µm, e.g. less than 250 µm, e.g. equal to about 200 µm, or even less than 200 µm. This has the effect of further decreasing the distance between the sensor structure of the first and second semiconductor die and further improves the match of the results. This effect is not offered by any of the prior art solutions known to the inventors. In fact, in order to obtain this effect, only the upper die needs to be thinned. In some embodiments the lower die has its normal thickness, which may improve mechanical stiffness or mechanical robustness.

In preferred embodiments the two semiconductor dies are galvanically separated from each other including the power and ground lines, meaning (inter alia) that the two semiconductor dies are wire-bonded to different pins of the package, for true redundancy.

These are the main underlying ideas of the present invention, which will be described in more detail further.

FIG. 1 to FIG. 6 are already described above.

Figure 7:
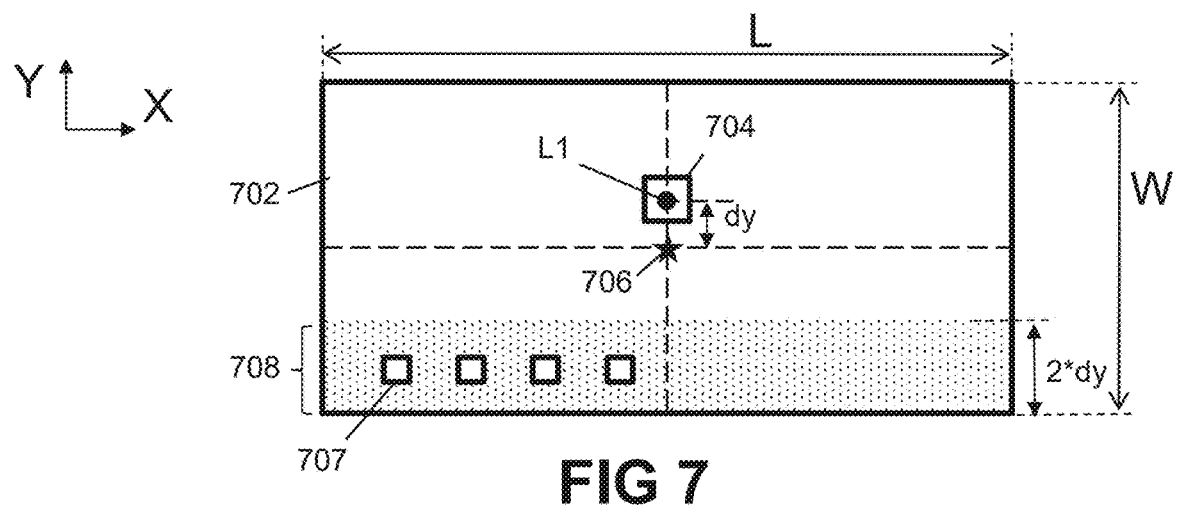
FIG. 7 to FIG. 9 illustrate a first exemplary embodiment of the present invention.
Figure 8:
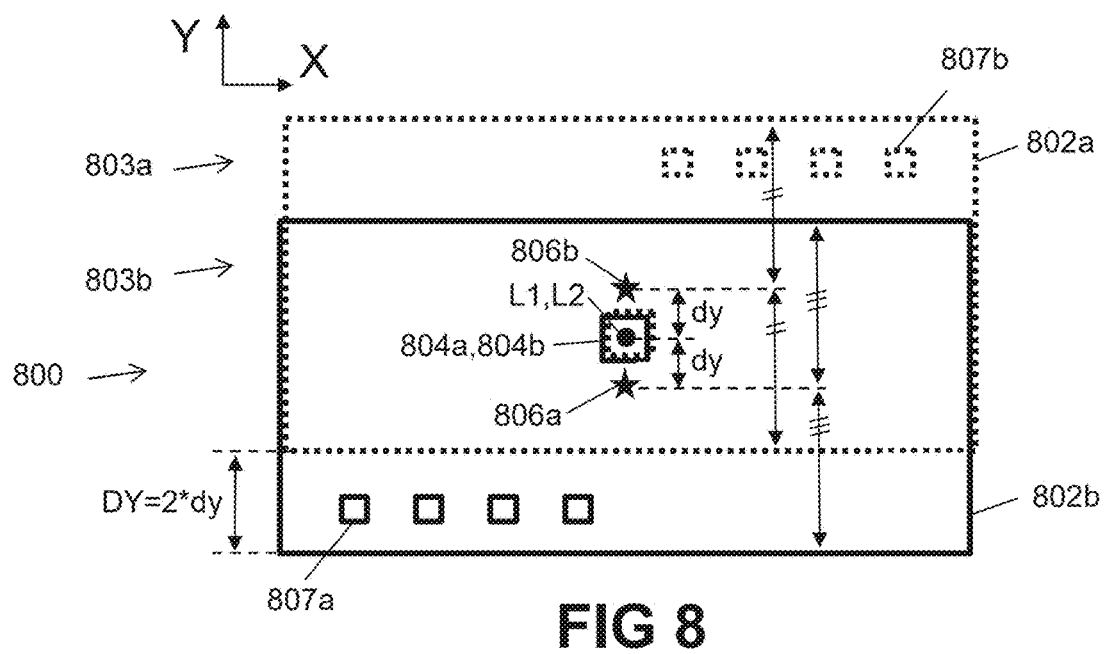
Figure 9:
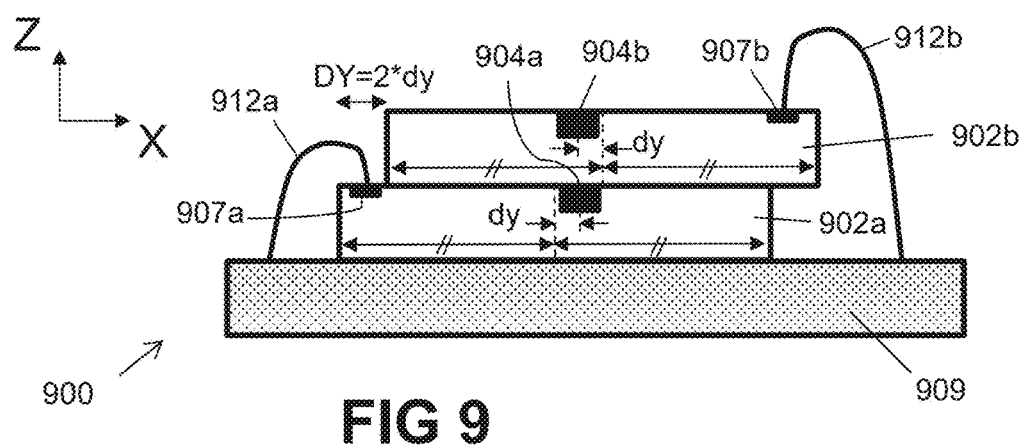

FIG. 7 to FIG. 9 illustrate a first exemplary sensor device 900, and the semiconductor dies used therein.

FIG. 7 shows a rectangular semiconductor die 702 having a length L (in the X-direction) and a width W (in the Y-direction), in top view. The length L is equal to, or larger than the width W. The rectangle has a geometric center 706, schematically indicated by a star, which is located at the intersection of two diagonals (not shown in FIG. 7, but see e.g. FIG. 20a), which is the same as the intersection of two lines parallel to the length direction and width direction halfway the length and the width (as shown in FIG. 7).

The semiconductor die 702 comprises a sensor or sensor structure 704, schematically represented by a square, in order not to complicate the drawing, having a "sensor location" L1 (e.g. in case of a magnetic sensor structure, known as the "magnetic centre") which, in this example, is offset from the geometric center 706 in the Y-direction by a predefined distance "dy". Examples of "sensor location" will be provided further (see e.g. "L1" and "L2" in FIG. 15 to FIG. 18), but stated in simple terms, the sensor location is a point located substantially "in the middle" of, or in the middle between the one or more sensitive elements.

The semiconductor die 702 preferably further comprises a zone 708 comprising a plurality of bond pads 707. This zone is located on an edge of the rectangle, (in the example on only one edge), and has a width of at most twice said offset "dy", thus, the width of zone 708≤2*dy. Or stated differently, for a given width of the pad zone 708, the offset "dy" between the sensor location and the geometrical center has to be at least 50% of said width. In preferred embodiments, this width has a value in the range from 110 to 250 µm, or from about 150 to about 210 µm, for allowing electrical connection to the lead frame, e.g. via wire-bonding, but the invention would also work with larger zones, for example a zone having a width up to 250 µm, or up to 300 µm, or up to 400 µm, or up to 450 µm.

FIG. 8 shows a stack 800 of two semiconductor dies 802a, 802b having the geometry (i.e. size and shape and relative location of the sensor structure and the bond pads) of FIG. 7, after rotating the upper die 802b by 180° around an axis perpendicular to the semiconductor dies, and after optionally shifting the upper die 802b such that the long edges of the upper and lower die are parallel but spaced apart by a distance DY equal to twice said offset dy, thus DY=2*dy. (for completeness, it is noted that, if the upper die is rotated about a rotation axis passing through the sensor location L1, no translation is needed).

As can be seen, by doing so, a stack is created in which a 2D projection of the geometric centers 806a, 806b are spaced apart by 2*dy, but the 2D projections of the sensor locations L1, L2 coincide. Thus, the sensor structures 804a and 804b are "aligned", meaning that they will measure substantially the same physical quantity. It is noted that, as will become clear further (see e.g. FIG. 16), the individual quantities measured by the sensitive elements of the first and second sensor structure 804a, 804b may be different, but the measurement result derived therefrom, for example an angular position, is substantially identical for both semiconductor dies.

It is furthermore noted that the sensor locations L1, L2 do not exactly coincide, but in reality, are spaced apart in the height direction by the thickness of the upper die 802b. However, for practical purposes, these two locations can be considered substantially "the same", especially if the upper semiconductor die 802b is "thinned", for example to a thickness lower than 350 micron, or lower than 250 micron, e.g. to about 200 micron. Moreover, in preferred embodiments of the present invention, the result measured by the sensor device as part of an angular position sensor system is highly insensitive to axial distance between the sensor device and the magnet anyway.

FIG. 9 shows the stack of FIG. 8 in side view, mounted on a lead frame 9. As can be appreciated, bond pads 907a of the first (lower) semiconductor die 902a can be electrically connected, e.g. wire-bonded to the lead frame 909 by means of first bond-wires 912a, and bond pads 907b of the second (upper) semiconductor die 902b can be electrically connected, e.g. wire bonded to the lead frame 909 by means of second bond wires 912b, without problems.

In contrast to FIG. 1, the semiconductor dies 902a, 902b of FIG. 9 are rotated by 180° and their edges are offset from each other, and no interposer is required. In contrast to FIG. 2, the sensor structures of FIG. 9 are aligned. In contrast to FIG. 3, the two semiconductor dies of FIG. 9 are both located on the same side of the lead frame and their active surfaces are oriented in the same direction (upwards), and bonding is only required on one side of the lead frame. In other words, the solution offered by the present invention has all the benefits of the prior art solutions.

While not explicitly shown, the stack 900 of FIG. 9 can be overmoulded in known ways, e.g. by a plastic compound, to form a packaged semiconductor device which can be used in automotive applications, for performing an actual measurement and a redundant measurement, e.g. for improving safety.

Preferably (as shown in FIG. 9) the two semiconductor dies 902a, 902b are directly stacked on top of each other, without an intermediate component (e.g. spacer or interposer). And preferably, at least the upper die 902b is thinned (not shown). This further decreases the distance between the two sensor structures 904a, 904b.

While not explicitly shown in FIG. 9, the first and second semiconductor die are preferably galvanically separated, including separate connection to ground and power supply pins. In order to provide sufficient isolation, the backside of the semiconductor dies may be provided with a passivation layer, for example an oxide layer or a nitride layer or combinations hereof. Alternatively, or in addition, electrical separation can also be provided by means of an electrically insulating layer between the semiconductor dies, e.g. an insulating tape, e.g. made of polyimide, e.g. having a thickness of about 50 to 100 µm.

In another variant (not shown), the sensor 704 is offset from the geometric centre in the X direction (length direction of the rectangle) rather than the Y direction (width direction of the rectangle), and the zone 708 with the bond pads 707 would be located near the short edge.

In another variant, the rectangle is a square, and the two dies are rotated over 180°.

Figure 10:
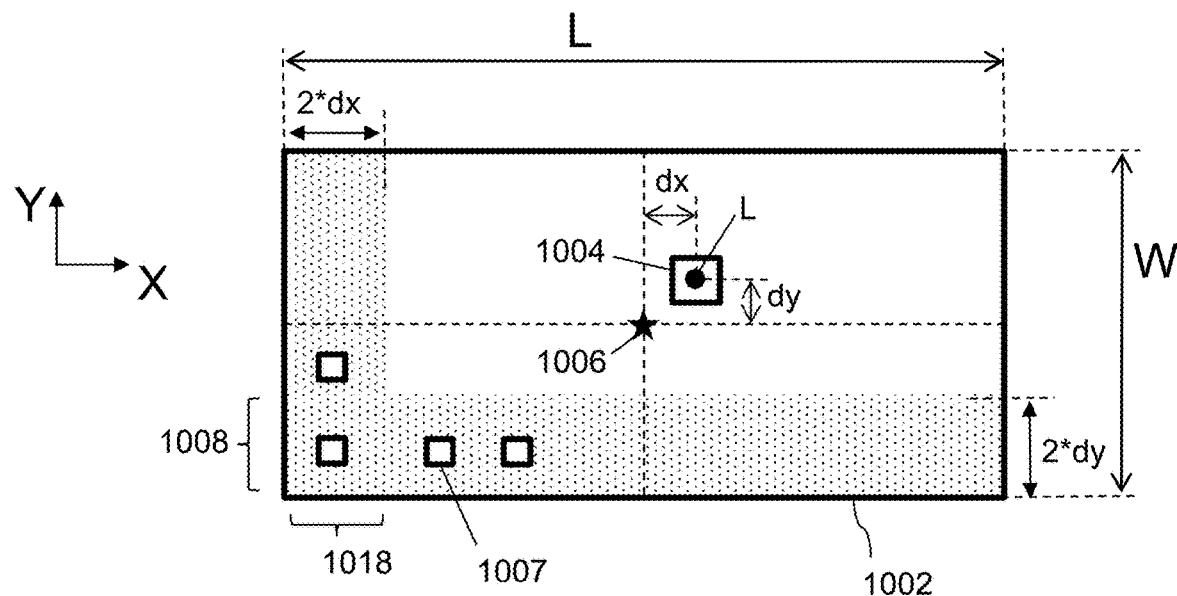
FIG. 10 to FIG. 11 illustrate a second exemplary embodiment of the present invention.
Figure 11:
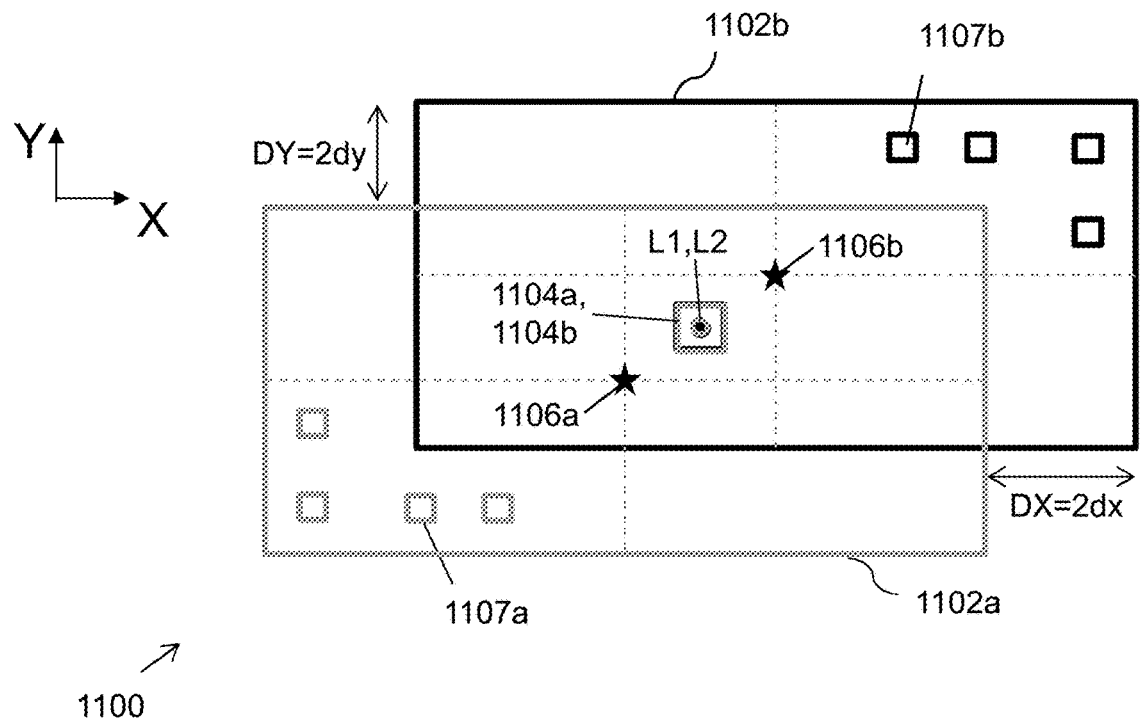

FIG. 10 and FIG. 11 illustrate a second example of a silicon die 1002 suitable for stacking, and a stacked die arrangement 1100 using two such silicon dies 1102a, 1102b, which can be seen as a variant of the stacked die arrangement 900 of FIG. 7 to FIG. 9.

FIG. 10 shows a second exemplary semiconductor die 1002 in top view. The semiconductor die has a rectangular shape, the geometric centre 1006 of which is indicated by a star. The semiconductor die has a sensor structure 1004 (schematically represented by a square for illustrative purposes) which is offset from the geometric centre 1006 by a predefined distance "dx" in the length direction (X) and which is offset from the geometric centre 1006 by a predefined distance "dy" in the width direction (Y). The semiconductor die has a plurality of bond pads 1007 which are located in a rectangular zone 1008 along an edge of the semiconductor die 1002 extending in the X-direction and having a width of at most 2*dy, and/or in a zone 1018 along an edge of the semiconductor die extending in the Y-direction and having a width of at most 2*dx, together forming an L shape. Or for given dimensions of the zones 1008 and 1018, if present, the minimum offset dx and dy can be determined.

FIG. 11 shows a stack 1100 of two semiconductor dies 1102a, 1102b shown in FIG. 10, after rotating the upper die by 180°, and after optionally shifting the upper die 1102b such that the dies are offset in the X direction by a distance DX=2 dx, and in the Y-direction by a distance DY=2 dy. (As mentioned above, if the rotation is performed about an axis passing through L1, L2, no translation is required, only the rotation). As can be seen, this causes alignment of the sensor locations L1, L2, so that the sensor structures 1104a, 1104b will measure substantially the same physical quantity, albeit rotated over 180°.

Similar as described in FIG. 7 to FIG. 9, the two semiconductor dies 1102a, 1102b may be thinned (e.g. to a thickness of about 100 to 350 micron, e.g. equal to about 200 micron), may be stacked directly on top of each other or by means of an intermediate insulating layer or insulating tape, are preferably galvanically separated including the provision of separate ground and power supply lines, and the stacked assembly may be overmoulded.

FIG. 7 to FIG. 11 described two exemplary embodiments of a packaged stacked die arrangement comprising two sensor structures, which are aligned such that a projection of the sensors in a direction perpendicular to the lead frame coincide.

In practice, the semiconductor dies may further comprise biasing circuitry for biasing the sensor structures, readout circuitry, amplification circuitry, digitisation circuitry, processing circuitry, etc., but since such circuits are not the main focus of the present invention, and are well known in the art, they need not be described in further detail herein. Suffice it to say that the principles of the present invention can be used in combination with any magnetic sensor structure, even sensor structures comprising integrated magnetic concentrators (IMC), provided that the alignment is sufficiently accurate, and that the thickness of the semiconductor dies is at least 100 micron, or at least 150 micron, or at least 200 micron.

The fact that the second semiconductor die is rotated by 180° with respect to the first semiconductor die, and may provide a measurement value (e.g. a rotation angle) different from that provided by the first semiconductor die, can easily be addressed by a post-processing step, which may be performed by the circuitry of one of the sensor devices itself, which may e.g. be programmed for rotating the result by 180°, or by an external processor (e.g. an ECU). Mathematically, the post-processing step can for example be as simple as adding 180° to the angle provided by the second semiconductor die, or subtracting 180°, such that the value lies in the range from 0° to 360°.

Figure 12:
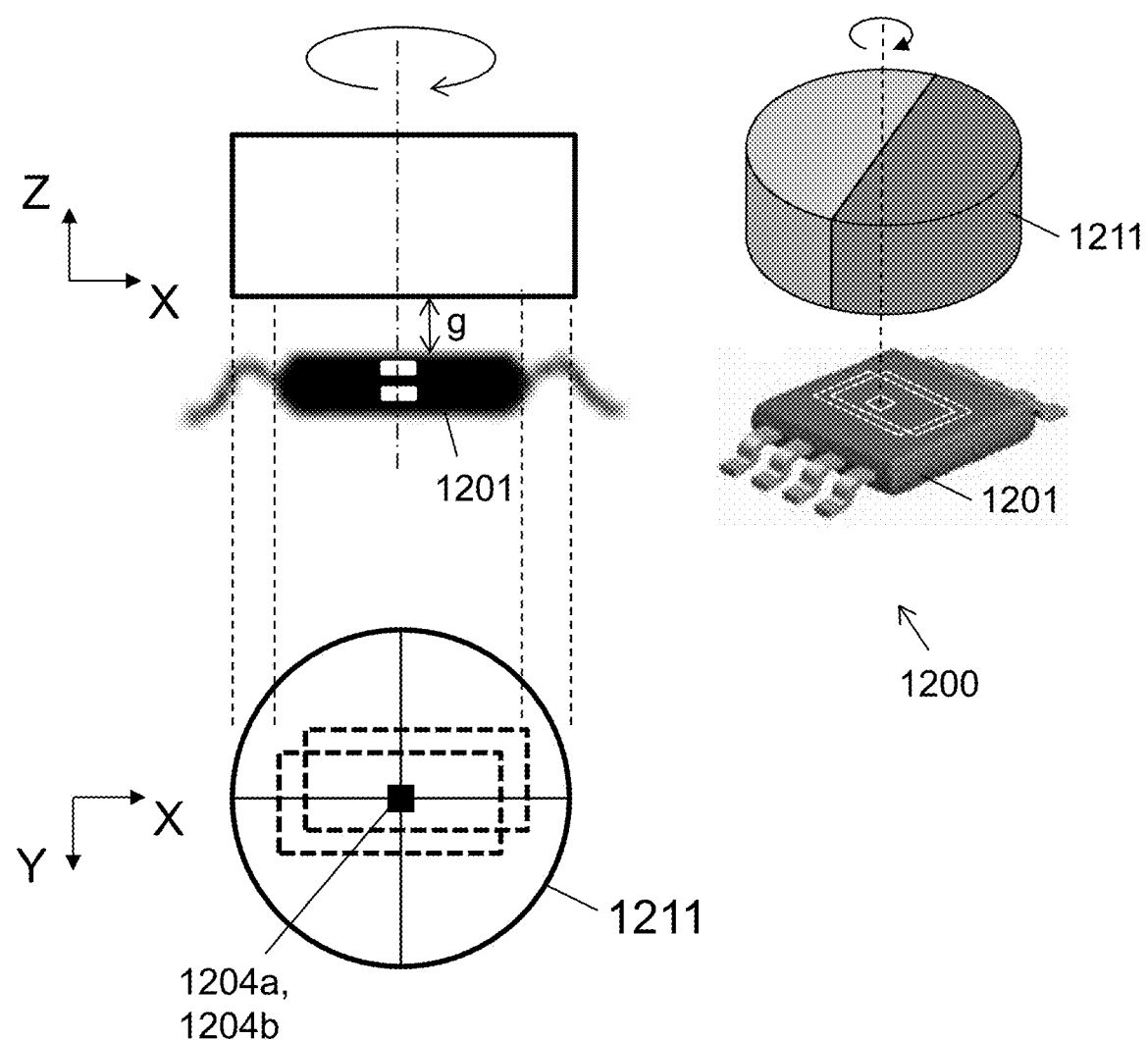
FIG. 12 is a schematic representation of a so called "on-axis assembly" of a magnet and a sensor device according to an embodiment of the present invention.
Figure 13:
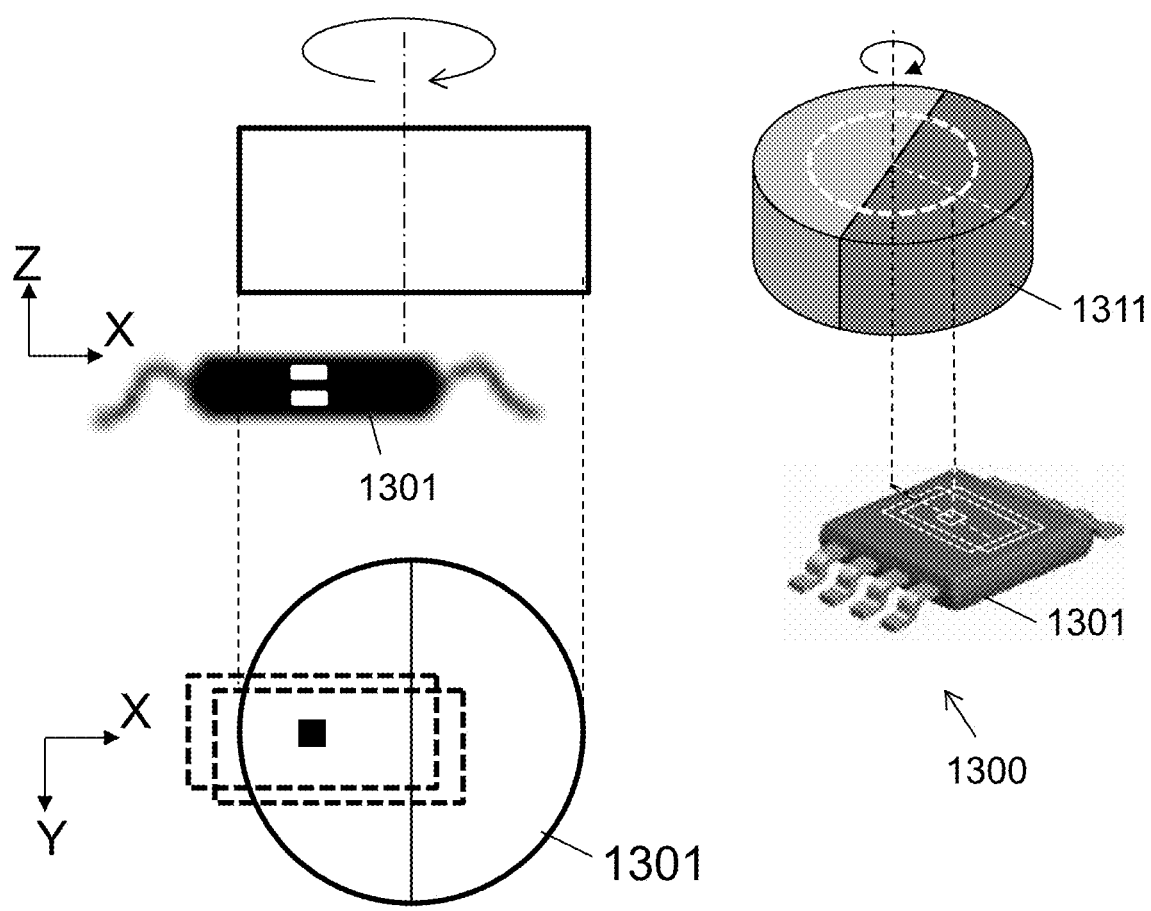
FIG. 13 is a schematic representation of a so called "off-axis assembly" of a magnet and a sensor device according to an embodiment of the present invention.
Figure 14:
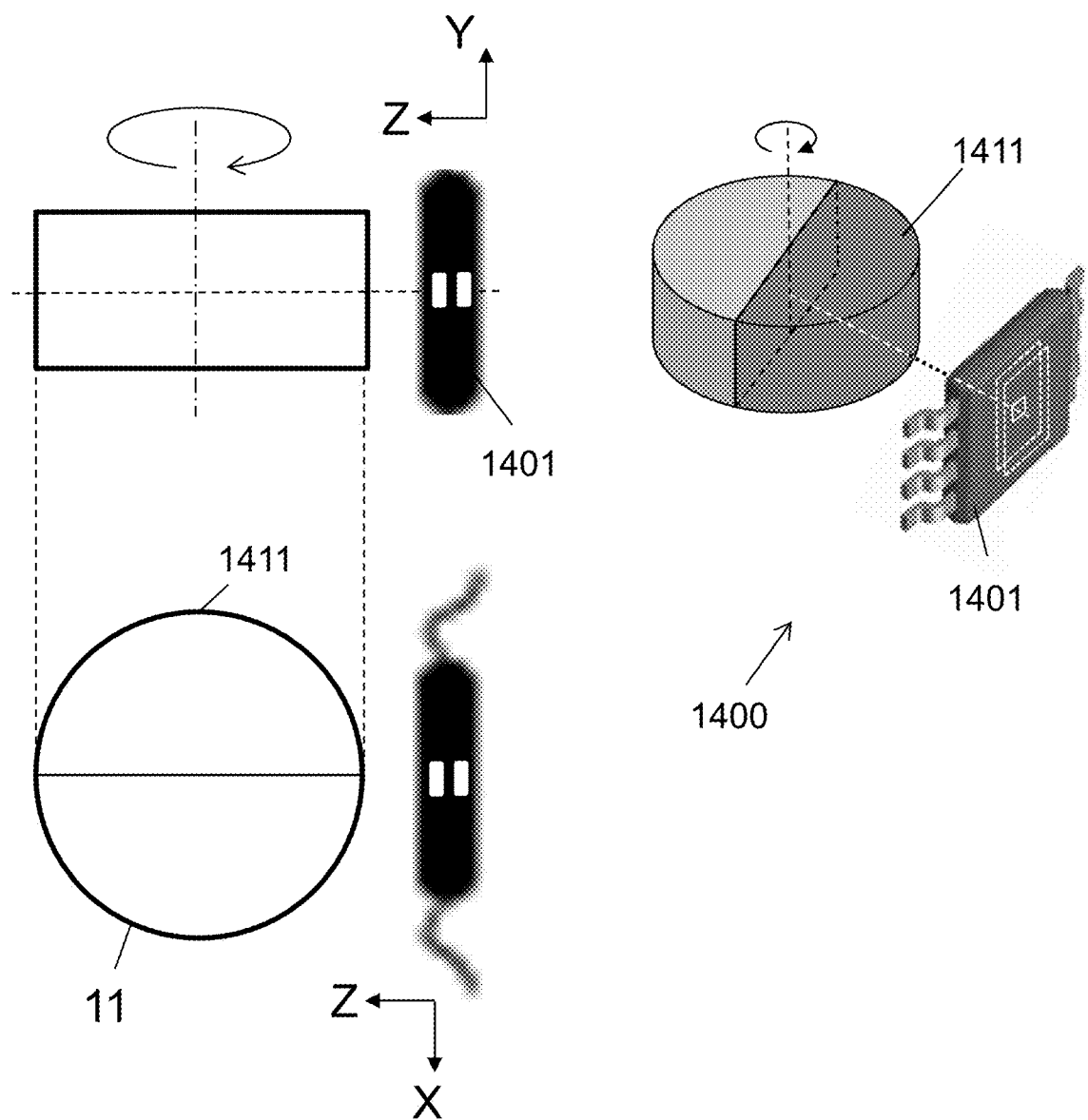
FIG. 14 is a schematic representation of a so called "through shaft" assembly of a magnet and a sensor device according to an embodiment of the present invention.

FIG. 12 to FIG. 14 show how sensor devices 1201, 1301, 1401 can improve the matching between the results provided by the two semiconductor dies comprised therein.

FIG. 12 shows an exemplary sensor system 1200, more in particular an angular position sensor system, comprising a permanent disk magnet 1211 and a sensor device 1201 in a so called "on-axis arrangement". The sensor device 1201 may for example have a stacked die arrangement as shown in FIG. 8 or FIG. 9 or FIG. 11. The two sensor structures 1204a, 1204b are schematically indicated by two black squares for illustrative reasons, which substantially coincide in 3D space, because the distance between them (in a direction perpendicular to the semiconductor dies) is typically only about 100 to 350 micron, e.g. about 200 micron, whereas the distance "g" between the magnet 1211 and the sensor device 1201 is typically an order of magnitude larger (e.g. about 2.0 to 5.0 mm).

It will be appreciated that both sensor structures 1204a, 1204b of the sensor device 1201 are aligned with the rotation axis of the magnet 1211, in contrast to FIG. 4, where both sensor structures are offset from said rotation axis. Furthermore, it can be appreciated that both sensor structures 1204a, 1204b of the device 1201 will sense substantially the same magnetic field. Hence, not only the individual results may be improved (related to unwanted offset from the rotation axis), but especially the result provided by the first semiconductor die and the second semiconductor die will be better matched (after taking into account the 180° rotation, of course). This makes the sensor device 1201 ideally suited for safety applications.

The example of FIG. 12 uses a disk-shaped magnet, but the present invention is not limited thereto and other magnets, such as bar magnets or ring magnets may also be used. In addition, while the magnet 1211 of FIG. 12 is a (e.g. diametrically magnetized or axially magnetized) two-pole magnet, higher order magnets may also be used, for example a quadrupole or a six-pole magnet. Of course, the sensor structure and/or algorithm used inside the sensor device 1201 has to correspond to the specific magnet being used, and with the location of the sensor device with respect to the magnet, in the example of FIG. 12 an on-axis position, as is the case with existing solutions. The interested reader can find suitable sensors for example in WO2014029885A1, incorporated herein by reference in its entirety, the present invention not being limited thereto.

FIG. 13 shows another exemplary sensor system 1300, more in particular an angular position sensor system, comprising a permanent disk magnet 1311 and a sensor device 1301 in a so called "off-axis arrangement". The same or similar remarks as given for FIG. 12 are also applicable here, mutatis mutandis.

Comparison of FIG. 13 and FIG. 5 shows that the sensor device 1301 does not suffer from the same angular offset problem of FIG. 5, because the two sensor structures (indicated by a black square) substantially coincide, as described above.

Many variants of this system are contemplated, for example having a four pole magnet and/or a ring magnet and/or a bar magnet and/or a specific sensor topology for measuring one or more magnetic field components and/or circuitry for determining one or more magnetic field gradients, and/or using a specific circuit or formula or algorithm for determining a linear or angular position based on one or more of these values. As stated above, the main focus of the present invention is not to describe such algorithms or such sensor topologies, the details of which are therefore omitted from the present disclosure. The interested reader can find suitable sensors for example in patent application EP19193068.4 filed by the same applicant on Aug. 22, 2019, refiled on 14 Aug. 2020 as patent application EP20191167.4, both of which are incorporated herein by reference in their entirety, in particular FIG. 5, FIG. 12 and FIG. 13 thereof, and the associated text, the present invention not being limited thereto.

FIG. 14 shows another exemplary sensor system 1400, more in particular an angular position sensor system, comprising a permanent disk magnet 1411 and a sensor device 1401 in a so called "through-shaft" arrangement. The same or similar remarks as given for FIG. 12 and FIG. 13 are also applicable here, mutatis mutandis. Suitable sensor structures are described for example in patent application EP19193068.4 and/or EP20191167.4, in particular FIG. 15 thereof, and the associated text, the present invention not being limited thereto.

Comparison of FIG. 14 and FIG. 6 shows that the sensor device 1401 does not suffer from the same angular offset problem of FIG. 6, because the two sensor structures of the two semiconductor dies of the present invention substantially coincide, as described above. Many variants of the system 1400 are contemplated, similar as described for FIG. 13.

Figure 15:
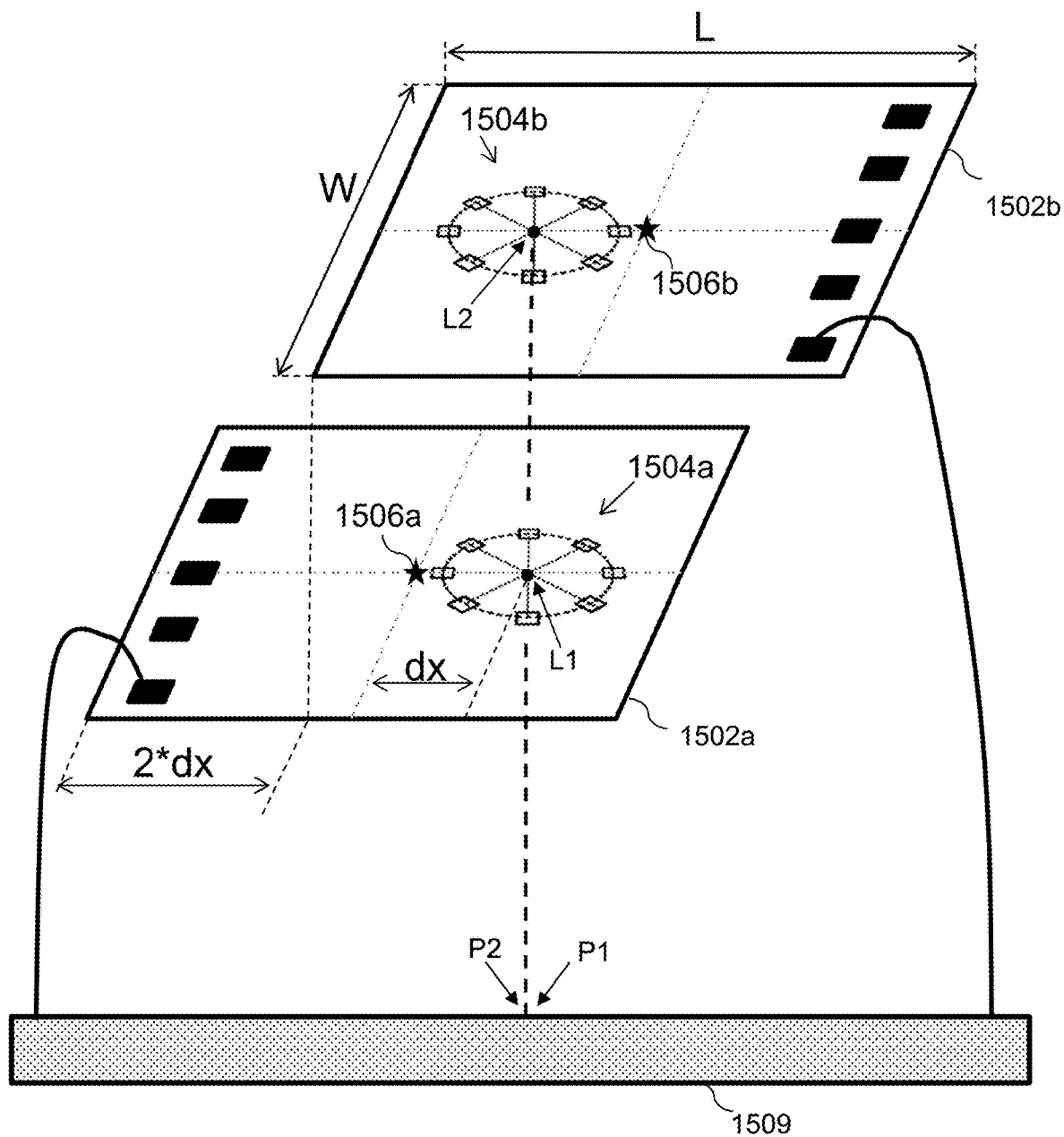
FIG. 15 is a schematic representation showing another exemplary embodiment of the present invention, which can be seen as a specific example of FIG. 9, where a magnetic sensor structure is used comprising eight horizontal Hall elements located on a circle.

FIG. 15 is a schematic representation of an exemplary sensor device 1500, having a lead frame 1509, electrically connected (e.g. wire-bonded) to two identical semiconductor dies 1502a, 1502b which are stacked, rotated and offset or shifted in the manner shown in FIG. 9.

The main purpose of FIG. 15 is to show an particular example of a sensor device according to the present invention, with a somewhat more complex sensor structure 1504, in this case consisting of eight horizontal Hall elements located on a circle, angularly spaced apart by 45° (described in detail in WO2014029885A1). When used in an on-axis position (as in FIG. 12 of the present application) in conjunction with a magnetic quadrupole, the circuitry on the first semiconductor die 1502a is capable of determining an angular position α1, and the circuitry on the second semiconductor die 1502b is capable of determining an angular position α2, which should be substantially equal to α1 within some tolerance margin, because the measurement range of these sensor structures is limited from 0° to 180°.

It is interesting to note that in the example of FIG. 15, individual sensor elements (here: horizontal Hall elements) of the first sensor structure 1504a of the lower semiconductor die 1502a are located at substantially the same locations as individual sensor elements (here: horizontal Hall elements) of the second sensor structure 1504b of the upper semiconductor die 1502b, but that is not absolutely required, as will be described further (see e.g. FIG. 16). What is important, however, is that the magnetic center L1 of the first sensor structure 1504a (here: the center of the circle on which the horizontal Hall elements are located) is aligned with the magnetic center L2 of the second sensor structure 1504b. This example also illustrates that the magnetic center L1 does not need to be located on a magnetic sensitive element but may be located between them.

In a variant of this system (not shown), the sensor structure of the second semiconductor die 1502b contains eight horizontal Hall elements located on a circle, spaced apart by 45°, but the radius of this circle being different (e.g. at least 10% larger or smaller) than the radius of the circle of the sensor structure of the first semiconductor die 1502a. In this case, the first and second semiconductor die have identical outer dimensions, and the relative position of the magnetic sensor structures is the same, but preferably also at least 50% of the other circuitry of the two semiconductor devices is identical, which simplifies the design, testing and evaluation of the semiconductor die.

Figure 16:
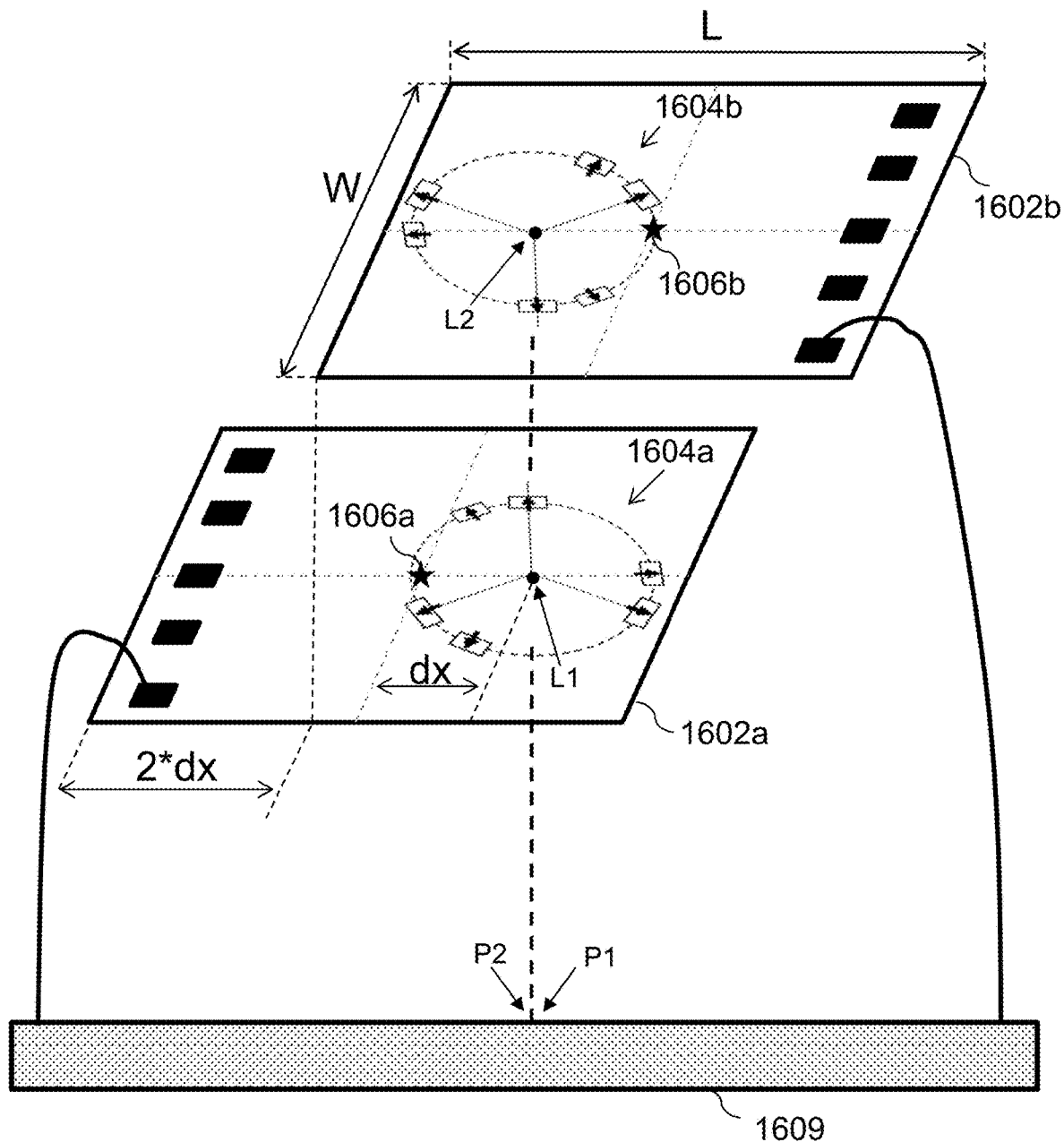
FIG. 16 is a schematic representation showing another exemplary embodiment of the present invention, which can be seen as another specific example of FIG. 9, where a magnetic sensor structure is used comprising six vertical Hall elements located on a circle, and oriented for measuring a radial field component.

FIG. 16 is a schematic representation of another exemplary sensor device 1600, having a lead frame 1609, electrically connected, e.g. wire-bonded to two identical semiconductor dies 1602a, 1602b which are stacked, rotated and offset or shifted in the manner shown in FIG. 9.

The main purpose of FIG. 16 is to show another particular example of a sensor device according to the present invention, with another somewhat complex sensor structure 1604, in this case consisting of six vertical Hall elements located on a circle, angularly spaced apart in a specific manner and oriented to measure a radial magnetic field component (as described in more detail in WO2014029885A1). When used in an on-axis position (as in FIG. 12 of the present application) in conjunction with a six-pole magnet, the circuitry (not shown) on the first semiconductor die 1602a is capable of determining an angular position α1 (in the range from 0° to 120°), and the circuitry on the second semiconductor die 1602b is capable of determining an angular position α2 (in the range from 0° to 120°), which should be substantially equal to (α1+60°+k*120°) within some tolerance margin, k being an integer value.

It is interesting to note that in the example of FIG. 16, individual sensor elements (here: vertical Hall elements) of the first sensor structure 1604a of the lower semiconductor die 1602a are not located at substantially the same locations as individual sensor elements of the second sensor structure 1604b of the upper semiconductor die 1602b, but between them. But that is OK, as long as the magnetic center L1 of the first sensor structure 1604a (here: the center of the circle on which the vertical Hall elements are located) is aligned with the magnetic center L2 of the second sensor structure 1604b.

As mentioned above, the present invention works with various sensor structures, some examples of which are shown in FIG. 17(a) to FIG. 17(f), together with a dot indicating the location of the "magnetic center" thereof. In contrast to FIG. 15 and FIG. 16, these sensor structures are shown in top view, but displayed next to each other rather than in perspective view, for illustrative purposes.

In FIG. 17(a), each sensor structure 4a, 4b has four vertical Hall elements. Such a sensor structure can for example be used to determine an angular position when used in conjunction with a dipole ring or disk magnet, and when mounted in an off-axis position or in a through-shaft position. (e.g. as described in more detail in patent application EP19193068.4 and/or EP20191167.4).

In FIG. 17(b), each sensor structure 4a, 4b has two sets of four Horizontal Hall elements arranged at the periphery of a disk-shaped IMC. Such a sensor structure can for example be used to determine an angular position when used in conjunction with a dipole ring or disk magnet, and when mounted in an off-axis position or in a through-shaft position (e.g. as described in more detail in patent application EP19193068.4 and/or EP20191167.4).

In FIG. 17(c), each sensor structure 4a, 4b has two vertical Hall elements and two Horizontal Hall elements. Such a sensor structure can for example be used to determine an angular position when used in conjunction with a dipole ring or disk magnet, and when mounted in an off-axis position or in a through-shaft position (e.g. as described in patent application EP19193068.4 and/or EP20191167.4).

FIG. 17(d) shows a variant of FIG. 17(a), which can be used in combination with a two-pole ring or disk magnet when mounted in an off-axis position or in a through-shaft position.

FIG. 17(e) shows a variant of FIG. 17(b), which can be used in combination with a two-pole ring or disk magnet when mounted in an off-axis position or in a through-shaft position.

FIG. 17(f) shows a variant of FIG. 17(c), which can be used in combination with a two-pole ring or disk magnet when mounted in an off-axis position or in a through-shaft position.

It is explicitly pointed out that the present invention is not limited to these particular sensor structures. They are chosen merely to illustrate that the sensor elements of the first and second semiconductor dies need not be exactly located on top of each other, and may even contain integrated magnetic concentrators (IMC) if the upper semiconductor substrate has a thickness of at least 100 micron, or at least 150 micron, or at least 200 micron. From the above, it should be clear to the skilled person that other sensor structures can also be used, for example sensor structures with magneto-resistive elements (not shown).

Figure 18:
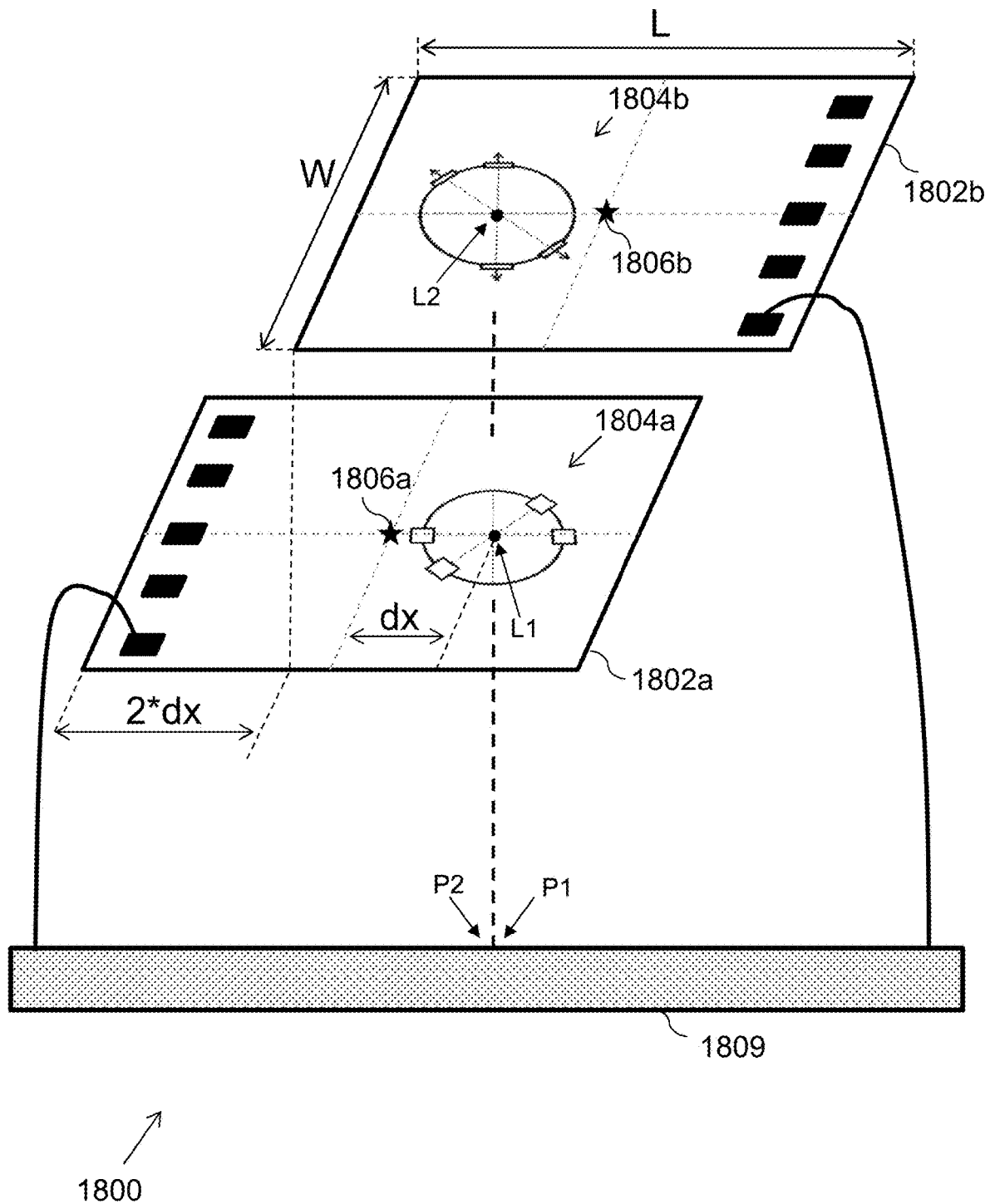
FIG. 18 shows another "stacked die assembly" according to an embodiment of the present invention, where the first and second semiconductor die have identical outer dimensions, but different magnetic sensor structures. The magnetic sensor structures are located offset from the geometric centers of the respective dies, and the dies are shifted and rotated relative to each other, such that the sensor structures are vertically aligned.

FIG. 15, FIG. 16 and FIG. 17 shows embodiments where the first and second sensor structure 4a, 4b of the first and second semiconductor substrate are identical. That is however not required for the present invention to work. It suffices that the two semiconductor dies have the same size and shape, and that the two sensor structures have the same offset dx, dy from the geometric center in order for the magnetic centers L1, L2 to coincide when stacked and rotated and offset (e.g. shifted) as described in FIG. 7 to FIG. 11. As an example, FIG. 18 shows a stacked die arrangement with two semiconductor dies 1802a, 1802b having different magnetic sensor structures 1804a, 1804b, configured for measuring the angular position of the respective semiconductor dies.

The present invention has been explained so far for rectangular semiconductor dies which are not square, which are rotated by 180° relative to each other, and offset (e.g. shifted) relative to each other. However, the present invention is not limited thereto, and will also work for two semiconductor dies having a square or rectangular shape, and having a sensor structure offset from its geometrical center, which are stacked, and rotated by another angle, for example 90°, or even an angle smaller than 90°, and optionally offset or shifted.

Figure 19A:
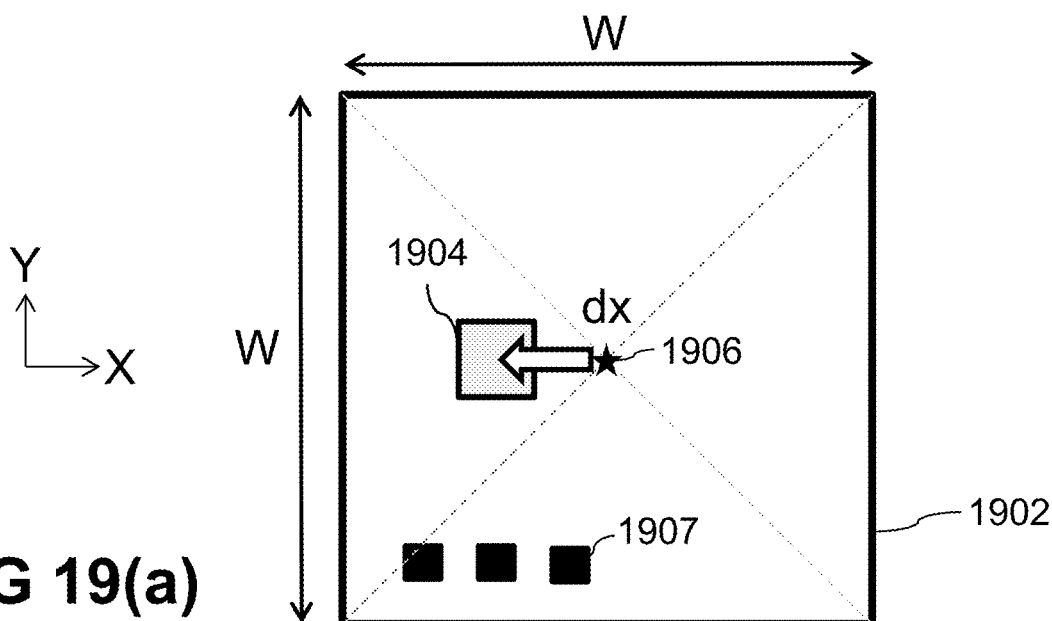
FIG. 19(*a*) shows a square semiconductor die having a sensor structure which is offset from the geometric center of the die in a direction parallel to one of its edges, in top view.

FIG. 19(a) shows a square semiconductor die 1902 having a sensor structure 1904 (schematically indicated by a square) which is offset by a distance "dx" in the X-direction from the geometric center 1906 of the semiconductor die 1902, in top view. In this example, the semiconductor dies have bond pads adjacent only one edge, and the shift over "dx" is in a direction parallel to the edge adjacent the bond pads 1907.

Figure 19B:
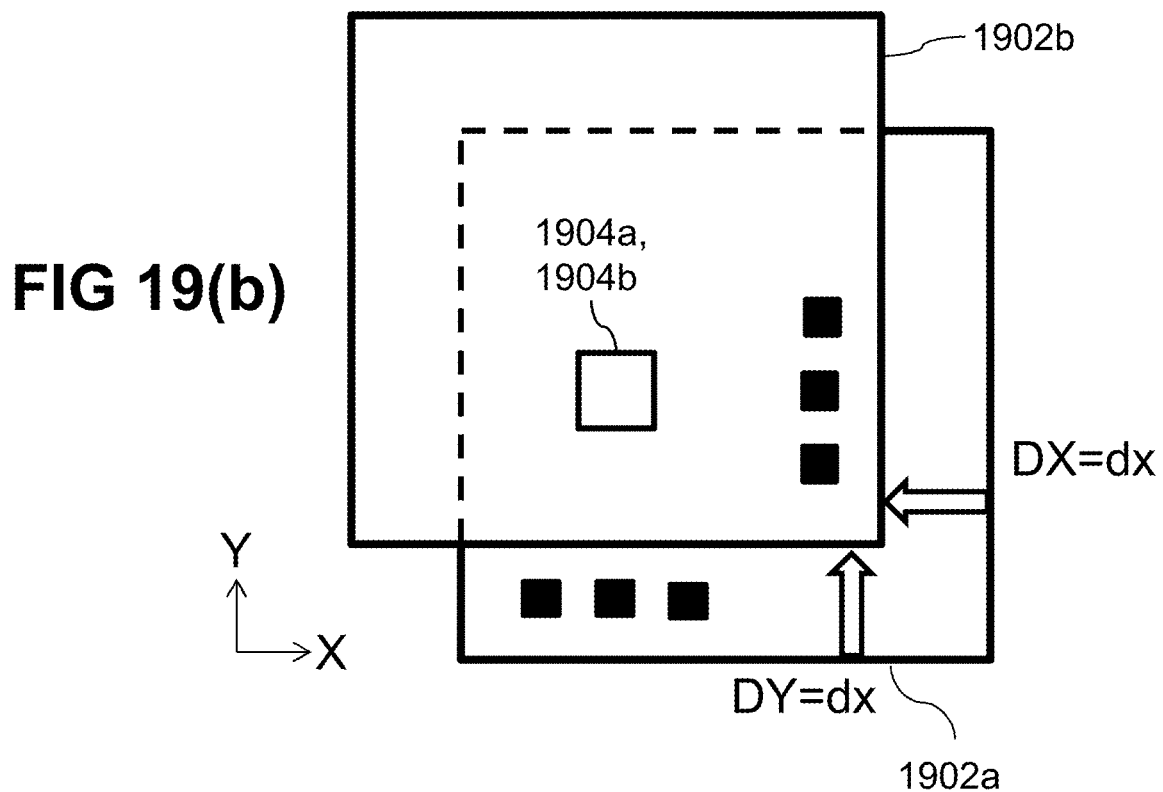

FIG. 19(b) shows a stack of two semiconductor dies shown in FIG. 19(a) in top view, after rotating the upper die 1902b by 90° with respect to the lower die 1902a, and after shifting the upper die in de X-direction by DX equal to dx, and in the Y-direction by DY equal to dx, so as to align the sensor structures 1904a, 1904b (schematically indicated by a square). As can be seen, the plurality of bond pads of both semiconductor dies are exposed for easy electrical connection to the lead frame (not shown), e.g. by wire-bonding.

In a variant of FIG. 19, the semiconductor die has bond pads along two of its edges (for example similar as in FIG. 21).

Figure 20A:
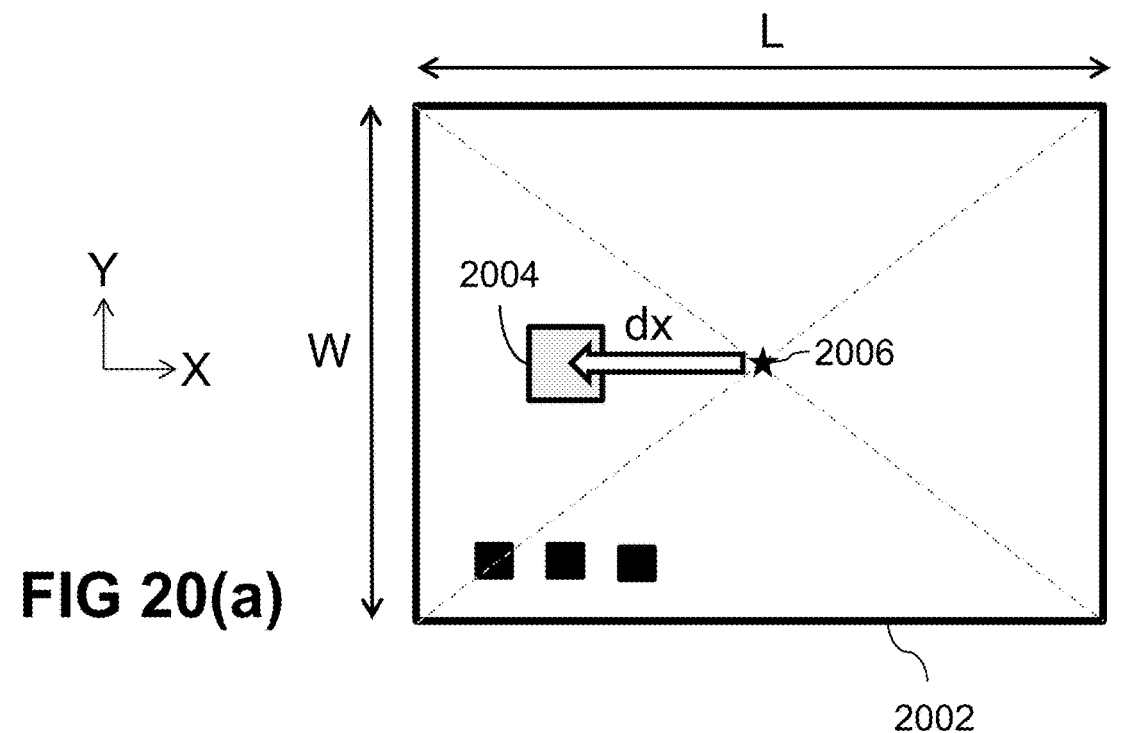
FIG. 20(*a*) shows a rectangular semiconductor die having a sensor which is offset from the geometric center of the die in a direction parallel to one of its edges, in top view. The die has bond pads on only one side.

FIG. 20(a) shows a rectangular semiconductor die 2002 having a sensor structure 2004 (schematically indicated by a square) which is offset by a distance "dx" in the X-direction from the geometric center 2006 of the die 2002, in top view. In this example, the semiconductor dies have bond pads adjacent only one edge, and the shift over "dx" is in a direction parallel to the edge adjacent the bond pads.

Figure 20B:
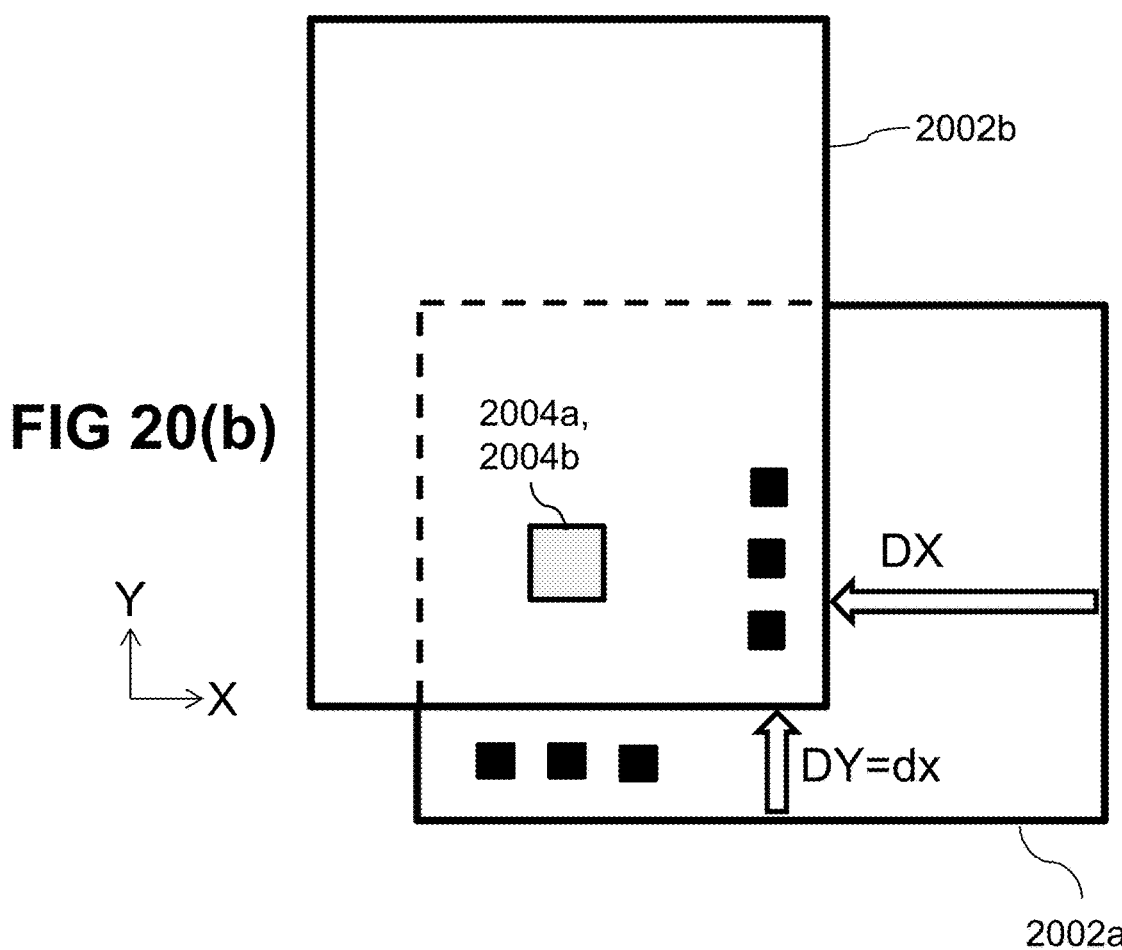

FIG. 20(b) shows a stack of two semiconductor dies shown in FIG. 20(a) in top view, after rotating the upper die 2002b by 90° with respect to the lower die 2002a, and after shifting the upper die 2002b in de X-direction by DX, and in the Y-direction by DY, so as to align their sensor structures 2004 (schematically indicated by a square). As can be seen, the plurality of bond pads of both semiconductor dies are exposed for easy electrical connection to the lead frame (not shown), e.g. by wire-bonding.

Figure 21A:
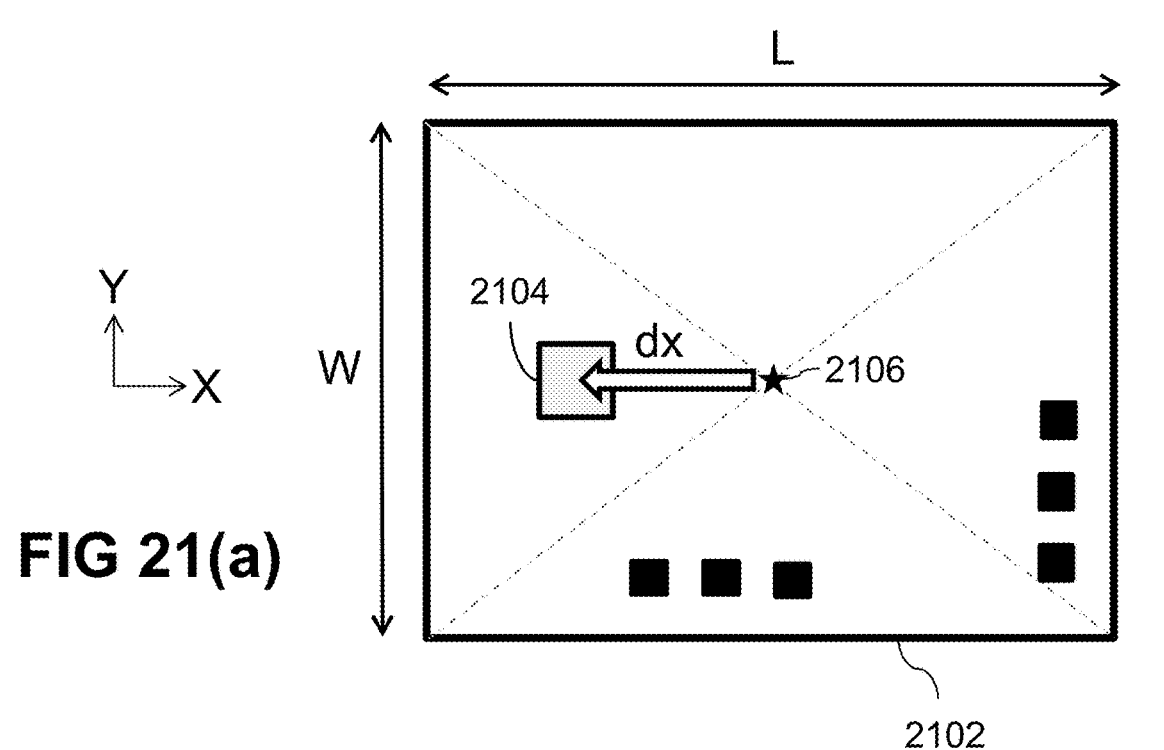
FIG. 21(*a*) shows a rectangular semiconductor die having a sensor which is offset from the geometric center of the die in a direction parallel to one of its edges, in top view. The die has bond pads on two sides.

FIG. 21(a) shows a semiconductor die 2102 which is a variant of the semiconductor die 2002 shown in FIG. 20(a), in that it has bond pads along two of its edges.

Figure 21B:
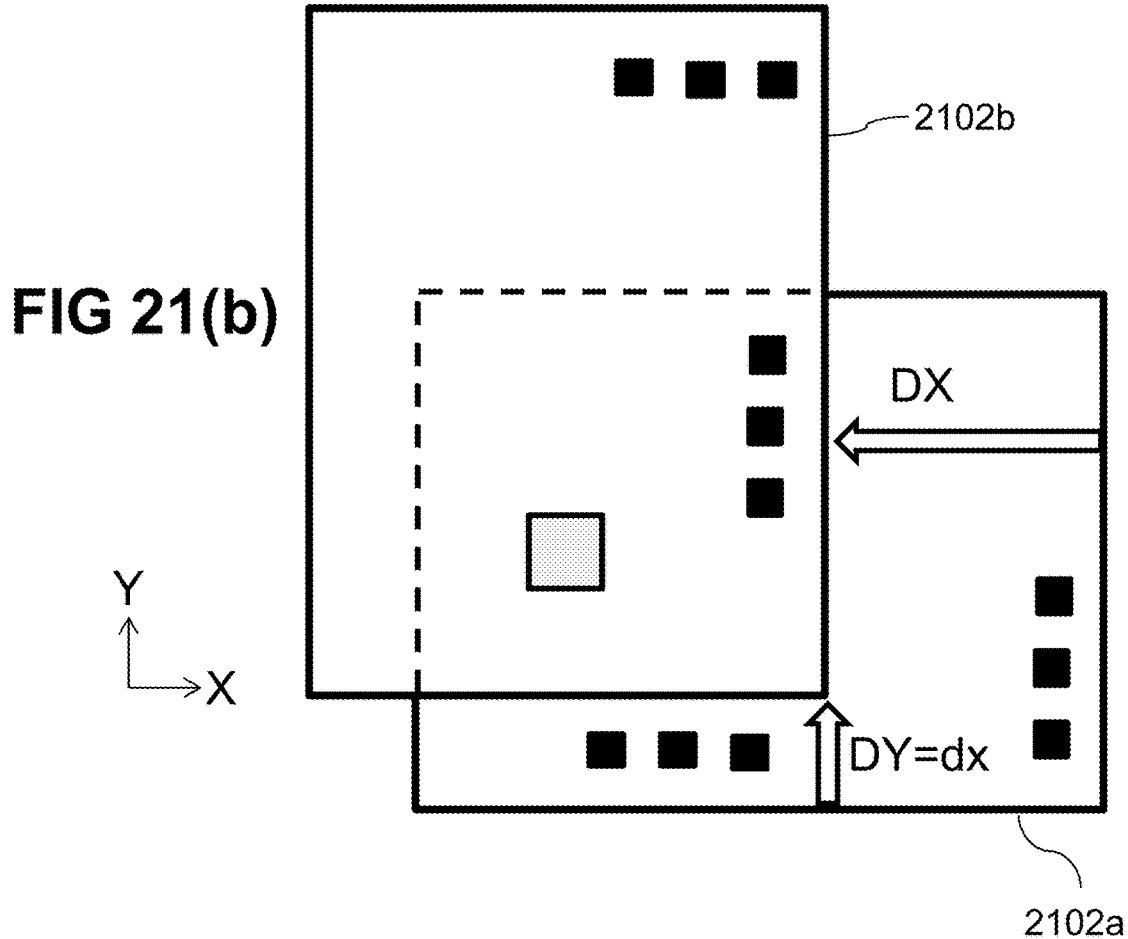

FIG. 21(b) shows a stacked die assembly which is a variant of the stacked die assembly of FIG. 20(b). As can be seen, the bond pads are exposed at the top side of the semiconductor dies and can easily be electrically connected to the lead frame, e.g. using wire-bonding.

Figure 22A:
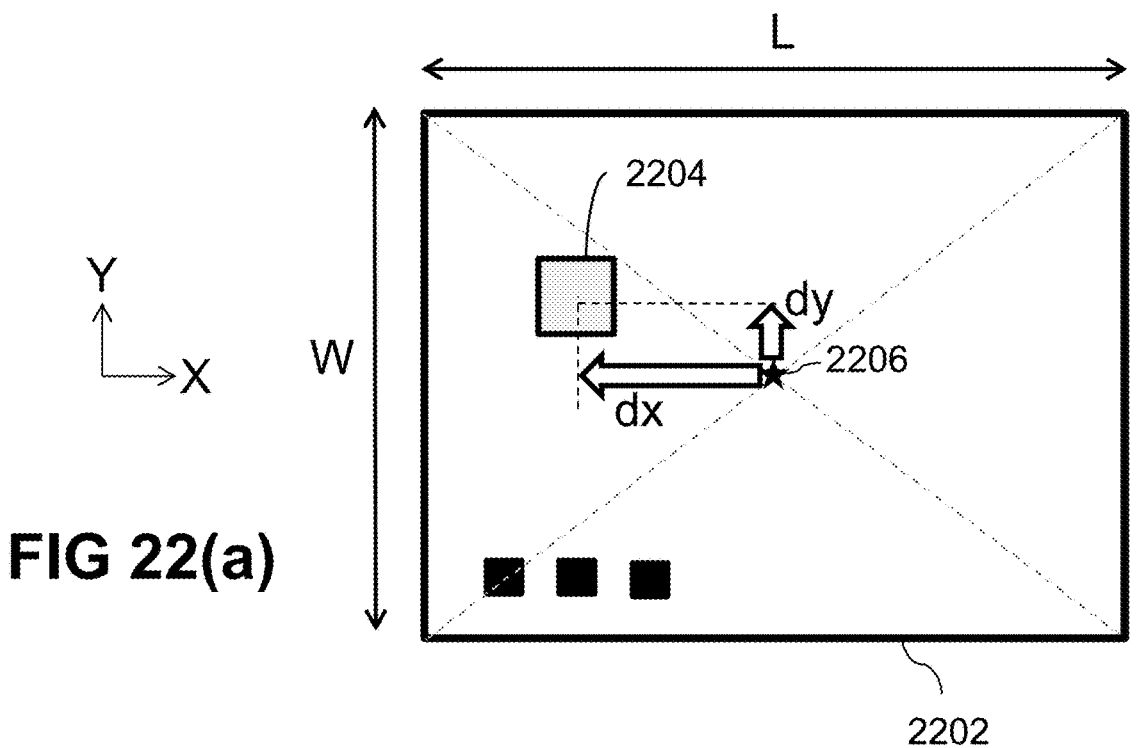
FIG. 22(*a*) shows a rectangular semiconductor die having a sensor which is offset from the geometric center of the die in two directions parallel to each of its edges, in top view.

FIG. 22(a) shows a rectangular semiconductor die 2202 having a sensor structure 2204 (schematically indicated by a square) which is offset by a distance "dx" in the length direction X and by a distance "dy" in the width direction Y from the geometric center 2206 of the semiconductor die 2202, in top view. This is a variant of FIG. 20(a) where the sensor structure 2204 is shifted in 2 directions. In this example, the semiconductor die has bond pads near only one edge.

Figure 22B:
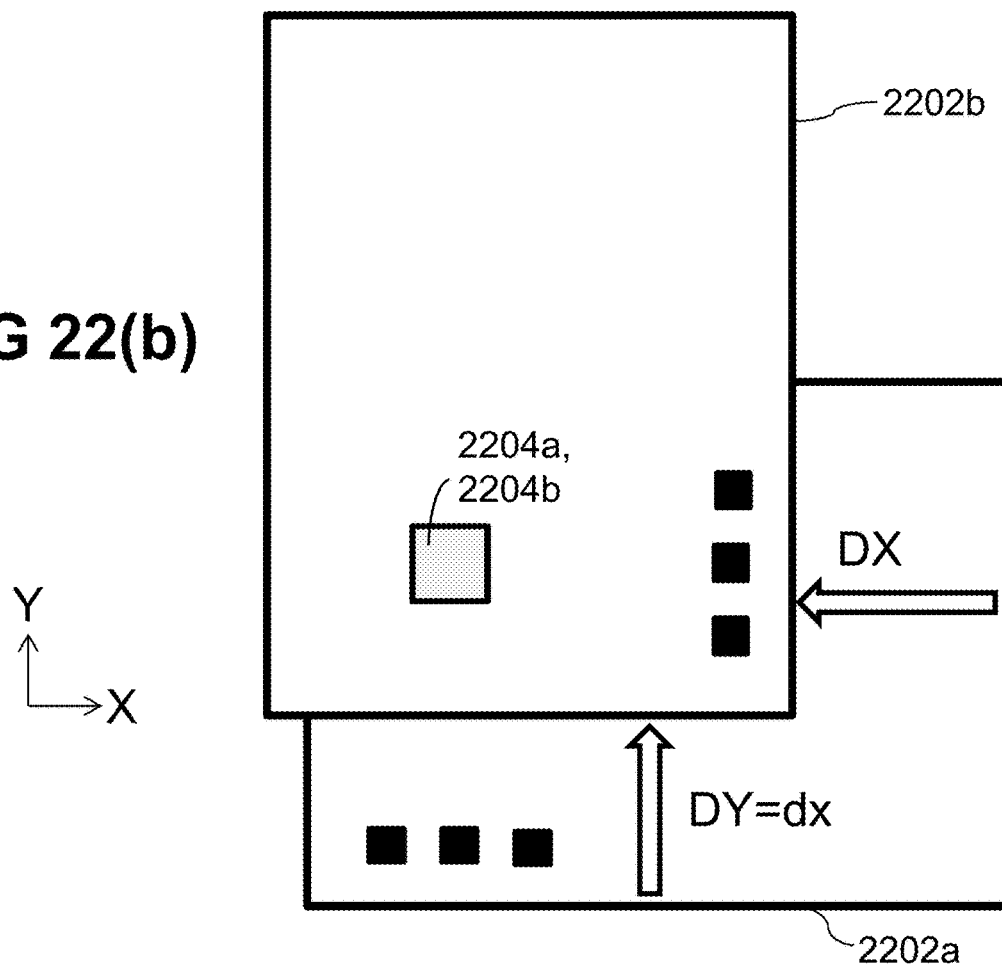

FIG. 22(b) shows a stack of two semiconductor dies shown in FIG. 22(a) in top view, after rotating the upper die 2202b by 90° with respect to the lower die 2202a, and optionally after shifting the upper die 2202b in de X-direction by DX and in the Y-direction by DY, so as to align their sensor structures 2204 (schematically indicated by a square). As can be seen, the plurality of bond pads of both semiconductor dies are exposed for easy electrical connection to the lead frame (not shown), e.g. by wire-bonding.

In a variant (not shown) of FIG. 22(a) and FIG. 22(b), the semiconductor dies have bond pads located adjacent two of its edges, for example, similar as shown in FIG. 21(a) and FIG. 22(b).

FIG. 23(a) shows a stack of two square semiconductor dies 2302a, 2302b in top view, each die having a sensor structure 2304 which is located at a position near one of its corners. In the example, the dies are stacked after rotating the upper die over about 15° about an axis normal to the semiconductor dies and passing through the magnetic centers, but other angles can also be used, for examples angles in the range from about 10° to about 85°, or from 15° to 80°, or from 15° to 40°. As can be seen, the plurality of bond pads of both semiconductor dies are exposed for easy electrical connection to the lead frame (not shown), e.g. by wire-bonding. The skilled person having the benefit of the present disclosure can easily find a suitable angle, for example by trial and error.

Figure 24:
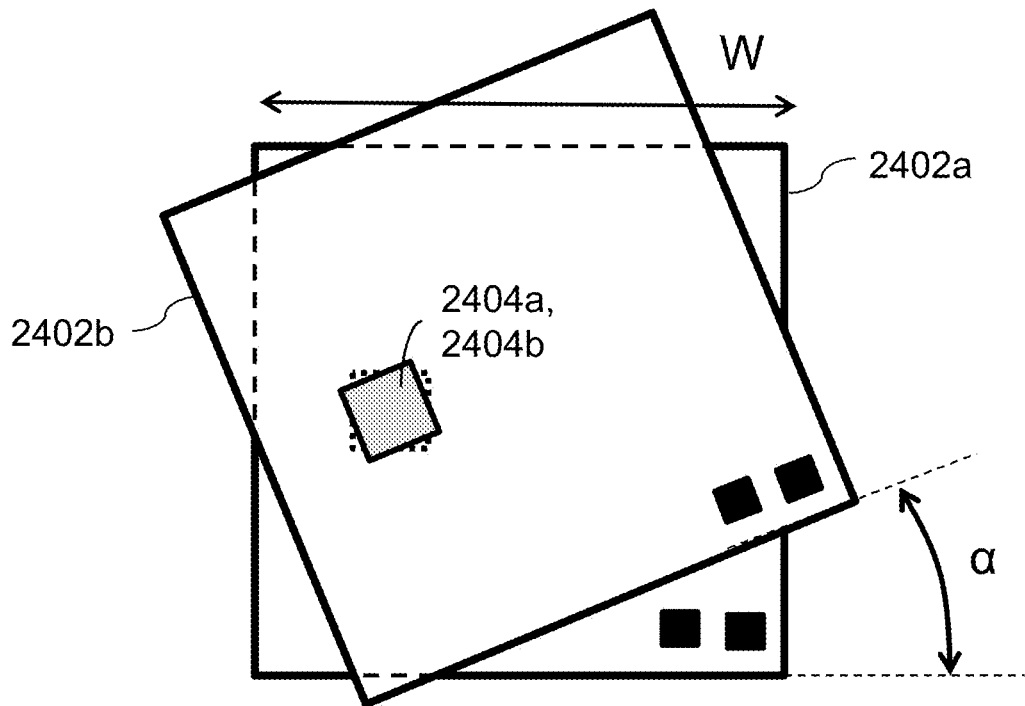
FIG. 24 shows a stack of two square semiconductor dies in top view, each die having a sensor which is offset from its geometrical center by approximately 25% of the width of the die. The dies are stacked after rotating the upper die over about 15°, and after shifting the upper die so as to vertically align the sensors, according to an embodiment of the present invention.

FIG. 24 shows a stack of two square semiconductor dies 2402a, 2402b in top view, each die having a respective sensor structure 2404a, 2404b which is offset from its geometrical center 2406a, 2406b by approximately 25% of the width W of the die. The dies are stacked after rotating the upper die over about 15° about an axis normal to the semiconductor dies and passing through the magnetic centers. As can be seen, the plurality of bond pads of both semiconductor dies are exposed for easy electrical connection to the lead frame (not shown), e.g. by wire-bonding. The skilled person having the benefit of the present disclosure can easily find a suitable angle, for example by trial and error.

For completeness, it is noted that the sensor structure cannot be shifted in just any direction. The following table provides a list of shifts that work:

TABLE 1

List of shifts

Figure 23:
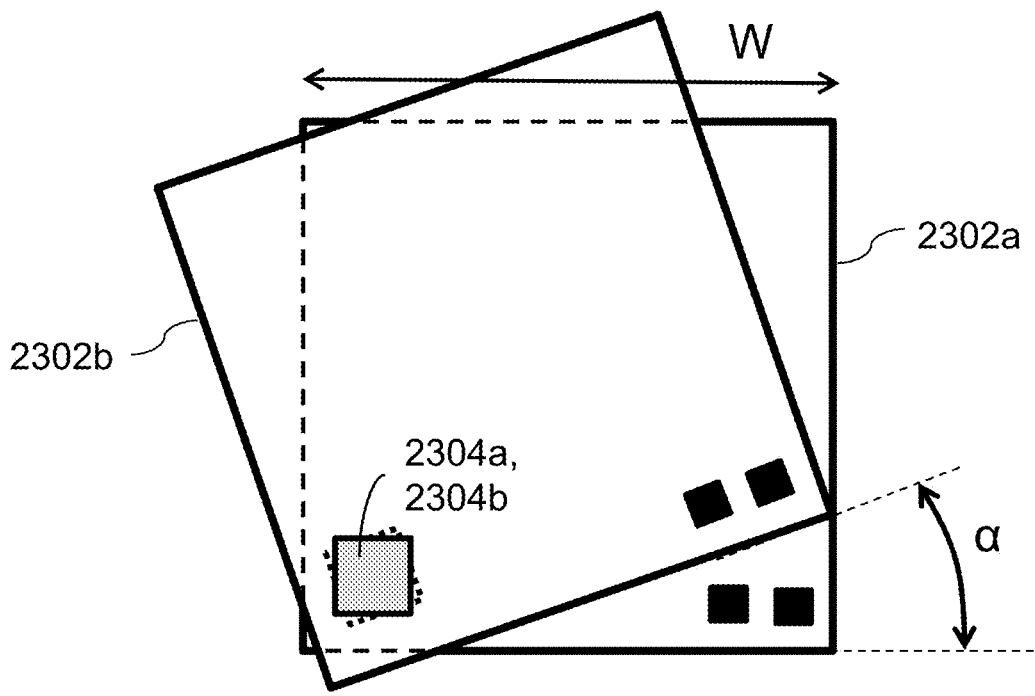
FIG. 23 shows a stack of two square semiconductor dies in top view, each die having a sensor which is offset from the geometric center of the die and is located at a position near the corner. The dies are stacked after rotating the upper die over about 15°, and after shifting the upper die so as to vertically align the sensors, according to an embodiment of the present invention.

| case | # pad zones | shift of dies | rotation | sensor location versus geometrical center of die | Example |
| --- | --- | --- | --- | --- | --- |
| A | 1 | DY only | 180° | shift away from pad zone, at least ZZ/2 in Y-direction | FIG. 7-9 |
| B | 2 | DX and DY | 180° | shift away from pad zones, at least ZZ/2 in each direction | FIG. 10-11 |
| C | 1 | DX and DY | 90° | shift parallel or away from pad zone, at least ZZ | FIG. 19, 20, 22 |
| D | 2 | DX and DY | 90° | shift parallel or away from both pad zones, at least ZZ | FIG. 21 |
| E | 1 | | 20°-90° | minimum angle is function of dx | FIG. 23, 24 | where ZZ is the width of the zone containing the bond pads.

The invention claimed is:

1. A magnetic sensor device comprising:
   a lead frame;
   a first semiconductor die implemented in a first CMOS technology node, the first semiconductor die comprising a first magnetic sensor structure and a plurality of first bond pads wire-bonded to the lead frame;
   a second semiconductor die implemented in a second CMOS technology node different from the first CMOS technology node, the second semiconductor die comprising a second magnetic sensor structure and a plurality of second bond pads wire-bonded to the lead frame.

2. The magnetic sensor device according to claim 1, wherein the first semiconductor die and the second semiconductor die are galvanically separated.

3. The magnetic sensor device according to claim 1, wherein the first semiconductor die is connected to first pins for ground and power supply and the second semiconductor die is connected to second pins for ground and power supply, the first pins being different than the second pins.

4. The magnetic sensor device according to claim 1,
   wherein the first semiconductor die is configured for providing a first linear or an angular position based on magnetic field components based on signals obtained from the first magnetic sensor structure, and the second semiconductor die is configured for providing a second linear or an angular position based on magnetic field gradients based on signals obtained from the second magnetic sensor structure; or
   wherein the first semiconductor die is configured for providing a first linear or an angular position based on magnetic field gradients based on signals obtained from the first magnetic sensor structure, and the second semiconductor die is configured for providing a second linear or an angular position based on magnetic field gradients based on signals obtained from the second magnetic sensor structure.

5. The magnetic sensor device according to claim 1,
   wherein the first magnetic sensor structure comprises horizontal Hall elements, and
   wherein the second magnetic sensor structure comprises vertical Hall elements.

6. The magnetic sensor device according to claim 1,
   wherein the first magnetic sensor structure comprises an integrated magnetic concentrator;
   and wherein the second magnetic sensor structure does not comprise an integrated magnetic concentrator.

7. The magnetic sensor device according to claim 1, wherein the first magnetic sensor structure and the second magnetic sensor structure are not identical.

8. The magnetic sensor device according to claim 1, wherein the first semiconductor die is configured for providing an actual measurement, and the second semiconductor die is configured for providing a redundant measurement.

9. The magnetic sensor device according to claim 1, wherein the first magnetic sensor structure and the second magnetic structure comprise one or more sensor elements selected from the group consisting of: horizontal Hall elements, vertical hall elements, and magneto-resistive elements.

10. A sensor system comprising:
    a magnetic sensor device according to claim 1; and
    a magnetic source arranged in a vicinity of the magnetic sensor device.

11. A magnetic sensor device comprising:
    a lead frame;
    a first semiconductor die comprising a first magnetic sensor structure and a plurality of first bond pads wire-bonded to the lead frame;
    a second semiconductor die comprising a second magnetic sensor structure and a plurality of second bond pads wire-bonded to the lead frame;
    wherein the first magnetic sensor structure comprises an integrated magnetic concentrator; and
    wherein the second magnetic sensor structure does not comprise an integrated magnetic concentrator.

12. The magnetic sensor device according to claim 11, wherein the first semiconductor die and the second semiconductor die are galvanically separated.

13. The magnetic sensor device according to claim 11, wherein the first semiconductor die is connected to first pins for ground and power supply and the second semiconductor die is connected to second pins for ground and power supply, the first pins being different than the second pins.

14. The magnetic sensor device according to claim 11, wherein the first magnetic sensor structure includes a first type of magnetic sensitive elements and the second magnetic sensor structure includes a second type of magnetic sensitive elements different from the first type of magnetic sensitive elements.

15. The magnetic sensor device according to claim 11, wherein the first magnetic sensor structure has a first physical arrangement of magnetic sensitive elements and the second magnetic sensor structure has a second physical arrangement of magnetic sensitive elements different than the first physical arrangement.

16. A sensor system comprising:
    a magnetic sensor device according to claim 11; and
    a magnetic source arranged in a vicinity of the magnetic sensor device.

* * * * *